United States Patent
Lai et al.

(10) Patent No.: US 11,121,052 B2
(45) Date of Patent: Sep. 14, 2021

(54) INTEGRATED FAN-OUT DEVICE, 3D-IC SYSTEM, AND METHOD

(71) Applicant: Taiwan Semiconductor Manufacturing Company, Ltd., Hsinchu (TW)

(72) Inventors: Yu-Chia Lai, Zhunan Township (TW); Cheng-Chieh Hsieh, Tainan (TW); Tin-Hao Kuo, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/559,246

(22) Filed: Sep. 3, 2019

(65) Prior Publication Data

US 2020/0251397 A1    Aug. 6, 2020

Related U.S. Application Data

(60) Provisional application No. 62/799,390, filed on Jan. 31, 2019.

(51) Int. Cl.
| | |
|---|---|
| *H01L 23/32* | (2006.01) |
| *H01L 21/56* | (2006.01) |
| *H01L 23/00* | (2006.01) |
| *H01L 23/48* | (2006.01) |
| *H01L 27/06* | (2006.01) |
| *H01L 23/31* | (2006.01) |

(52) U.S. Cl.
CPC ............ *H01L 23/32* (2013.01); *H01L 21/565* (2013.01); *H01L 23/3178* (2013.01); *H01L 23/481* (2013.01); *H01L 24/09* (2013.01); *H01L 24/33* (2013.01); *H01L 27/0688* (2013.01); *H01L 2224/02331* (2013.01); *H01L 2224/02372* (2013.01); *H01L 2224/02379* (2013.01)

(58) Field of Classification Search
CPC ... H01L 23/32; H01L 21/565; H01L 23/3178; H01L 23/481; H01L 24/09; H01L 24/33; H01L 27/0688; H01L 23/03178; H01L 23/49833
USPC .................. 257/774, 773, 777; 438/629, 637
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |

(Continued)

*Primary Examiner* — Thinh T Nguyen
(74) *Attorney, Agent, or Firm* — Slater Matsil, LLP

(57) ABSTRACT

A three dimensional integrated circuit (3D-IC) module socket system includes an integrated Fan-Out (InFO) adapter having one or more integrated passive devices (IPDs) embedded in the InFO adapter. The InFO adapter is also integrated into the 3D-IC module socket system by stacking the InFO adapter between a socket and a SoW package. The InFO adapter with embedded IPDs allows for more planar area of the SoW package to be available for interfacing the socket and provides a short distance between the embedded IPDs and computing dies of the SoW package which enhances a power distribution network (PDN) performance and improves current handling of the 3D-IC module socket system.

20 Claims, 16 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2004/0212030 A1* | 10/2004 | Asai | H05K 1/0274 285/14 |
| 2018/0102313 A1* | 4/2018 | Shih | H01L 23/49838 |

* cited by examiner

INTEGRATED FAN-OUT DEVICE, 3D-IC SYSTEM, AND METHOD

PRIORITY CLAIM AND CROSS-REFERENCE

This application claims the benefit of U.S. Provisional Application No. 62/799,390, filed on Jan. 31, 2019, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, passive devices such as resistors, capacitors, inductors, transformers, diodes, and the like and active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
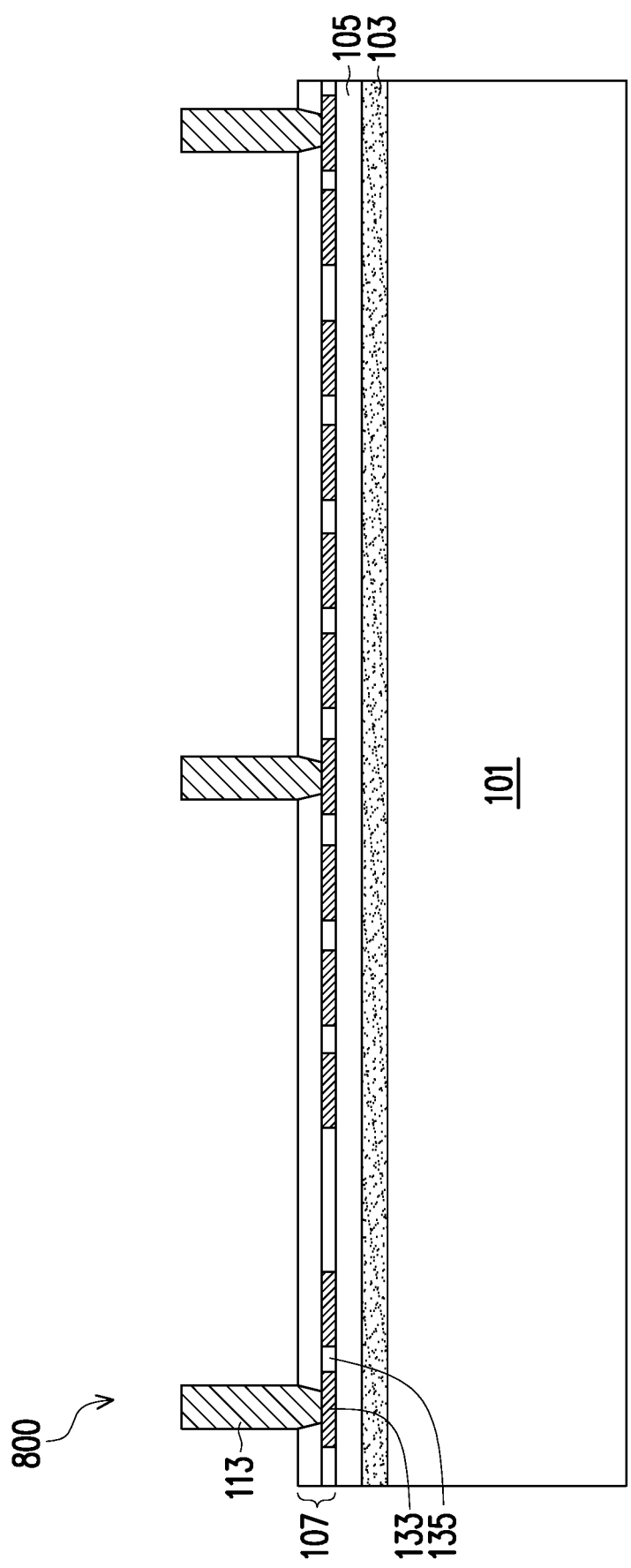
FIGS. 1-8 illustrate, in accordance with some embodiments, intermediate steps in a formation of an integrated fan-out (InFO) adapter comprising an embedded integrated device (InD), also referred to herein as an embedded InD InFO adapter.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While embodiments are described in detail below, a general description of the present disclosure is provided herein. Embodiments described herein are directed towards a three dimensional integrated circuit (3D-IC) module socket system wherein one or more semiconductor dies (e.g., integrated passive devices (IPDs) and/or integrated active devices (IADs)) are integrated into an integrated Fan-Out (InFO) adapter that is also referred to herein as an embedded integrated device (InD) InFO adapter (e.g., embedded InD InFO adapter). The embedded InD InFO adapter is also integrated into a system-on-wafer (SoW) package such as, a super large fan-out wafer-scale package with an area greater than or equal to 10,000 mm$^2$, by stacking the embedded InD InFO adapter between a socket (e.g., socket for connection to a power module) and the SoW package. Although embodiments are described herein with respect to a socket, it is understood that other devices (e.g., a semiconductor chip, a semiconductor package, a printed circuit board (PCB) module, or the like), according to other embodiments, may replace the socket without departing from the spirit of the embodiments disclosed herein.

Features of some or all of the embodiments described herein may include a shorter distance between one or more semiconductor dies (e.g., integrated passive device (IPD), integrated active device (IAD), or the like) integrated into an integrated Fan-Out (InFO) adapter and the functional integrated circuit dies of a system on wafer (SoW) package, which enhances a power distribution network (PDN) performance of the system. Integration of a 3D stacked IPD is compatible with existing InFO processes, thus making adoption of the embodiment practical. The 3D stacking and integration of IPDs into the InFO adapter allows for more of the Ball Grid Array (BGA) at the interface with the SoW to be dedicated to the socket landscape (also referred to herein as socket footprint). As such, improved current handling is also achieved with the 3D stacking and integration of IPDs into the InFO adapter design.

FIG. 1 illustrates a formation of through vias (TVs) (e.g., TVs 113) in an intermediate step of forming an embedded InD InFO adapter 800, in accordance with some embodiments. In particular, FIG. 1 illustrates a first carrier substrate 101 with a first adhesive layer 103 and a polymer layer 105 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices (e.g., passive devices, active devices, or the like), as discussed below.

The first adhesive layer 103 is placed on the first carrier substrate 101 in order to assist in the adherence of overlying structures (e.g., the polymer layer 105). In an embodiment the first adhesive layer 103 may comprise a light to heat conversion (LTHC) coating. However, other types of adhesives, such as ultra-violet glue, which loses its adhesive properties when exposed to ultra-violet light, pressure sensitive adhesives, radiation curable adhesives, epoxies, combinations of these, or the like, may also be used. The first adhesive layer 103 may be placed onto the first carrier substrate 101 in a semi-liquid or gel form, which is readily deformable under pressure.

The polymer layer 105 is placed over the first adhesive layer 103 and is utilized in order to protect, for example, the attached semiconductor devices (e.g., passive devices, active devices, or the like) once the devices have been attached. In an embodiment the polymer layer 105 may be polybenzoxazole (PBO), although any suitable material, such as polyimide or a polyimide derivative may also be utilized. The polymer layer 105 may be placed using, e.g., a spin-coating process to a thickness of between about 0.5 µm and about 10 µm, such as about 5 µm, although any suitable method and thickness may also be used.

Once the polymer layer 105 has been formed, a first redistribution layer (RDL) (e.g., first RDL 107) may be formed over the polymer layer 105. In an embodiment the first RDL 107 comprises a first series of conductive layers 133 (such as two conductive layers) embedded within a first series of dielectric layers 135 (such as three dielectric layers). In an embodiment, a first conductive layer of the first series of conductive layers 133 is formed over the polymer layer 105. In an embodiment the first conductive layer of the first series of conductive layers 133 may be formed by initially forming a first seed layer (not shown) of a titanium copper alloy through a suitable formation process such as chemical vapor deposition (CVD) or sputtering. A photoresist (also not shown) may then be formed to cover the first seed layer, and the photoresist may then be patterned to expose those portions of the first seed layer that are located where the first conductive layer of the first series of conductive layers 133 is desired to be located.

Once the photoresist has been formed and patterned, a conductive material, such as copper, may be formed on the first seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or physical vapor deposition (PVD), may be used to form the first conductive layer of the first series of conductive layers 133. Once the conductive material has been formed, the photoresist may be removed through a suitable removal process such as ashing. Additionally, after the removal of the photoresist, those portions of the first seed layer that were covered by the photoresist may be removed through, for example, a suitable etch process using the conductive material as a mask.

Once the first conductive layer of the first series of conductive layers 133 has been formed, a first dielectric layer of the first series of dielectric layers 135 is formed over the first conductive layer of the first series of conductive layers 133, and the first dielectric layer of the first series of dielectric layers 135 may be a material such as polybenzoxazole (PBO), although any suitable material, such as polyimide or a polyimide derivative may be utilized. The first dielectric layer of the first series of dielectric layers 135 may be placed using, e.g., a spin-coating process, although any suitable method may be used.

Once the first dielectric layer of the first series of dielectric layers 135 has been formed, a second one of the first series of conductive layers 133 and a second one of the first series of dielectric layers 135 may be formed by repeating steps similar to the first dielectric layer of the first series of dielectric layers 135 and the first conductive layer of the first series of conductive layers 133. These steps may be repeated as desired in order to electrically connect each of the first series of conductive layers 133 to an underlying one of the first series of conductive layers 133, and may be repeated as often as desired until an uppermost one of the first series of conductive layers 133 and an uppermost one of the series of dielectric layers 131 has been formed. In an embodiment the formation of the first series of conductive layers 133 and the first series of dielectric layers 135 may be continued until the first RDL 107 has a desired number of layers, such as two layers, although any suitable number of individual layers may be utilized. Furthermore, the first RDL 107 may also be referred to herein as a backside metallization layer of the embedded InD InFO adapter 800.

Once the first RDL 107 has been formed over the first carrier substrate 101, the TVs 113 are formed in electrical connection with the first RDL 107. In an embodiment the TVs 113 may be formed by initially forming a seed layer (not separately illustrated in FIG. 1). In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or plasma enhanced chemical vapor deposition (PECVD) processes, depending upon the desired materials. The seed layer may be formed to have a thickness of between about 0.3 µm and about 1 µm, such as about 0.5 µm.

Once the seed layer has been formed, a photoresist (also not illustrated in FIG. 1) is placed over the seed layer. In an embodiment the photoresist may be placed on the seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern that may be used to form the TVs 113 in such a placement as to be located on different sides of subsequently attached semiconductor devices as is discussed in more detail below. However, any suitable arrangement for the pattern of the TVs 113 may be utilized.

In an embodiment the TVs 113 are formed within the photoresist from one or more conductive materials, such as copper, tungsten, other conductive metals, or the like, and may be formed, for example, by electroplating, electroless plating, or the like. For example, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the TVs 113 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the TVs 113) may be removed by, for example, a wet or dry etching process. For example, in a dry etching process reactants may be directed towards the seed layer using the TVs 113 as masks. In another embodiment, etchants may be sprayed or otherwise put into contact with the seed layer in order to remove the exposed portions of the seed layer. After the exposed portion of the seed layer has been etched away, a portion of the first RDL 107 is exposed between the TVs 113.

Figure 2:
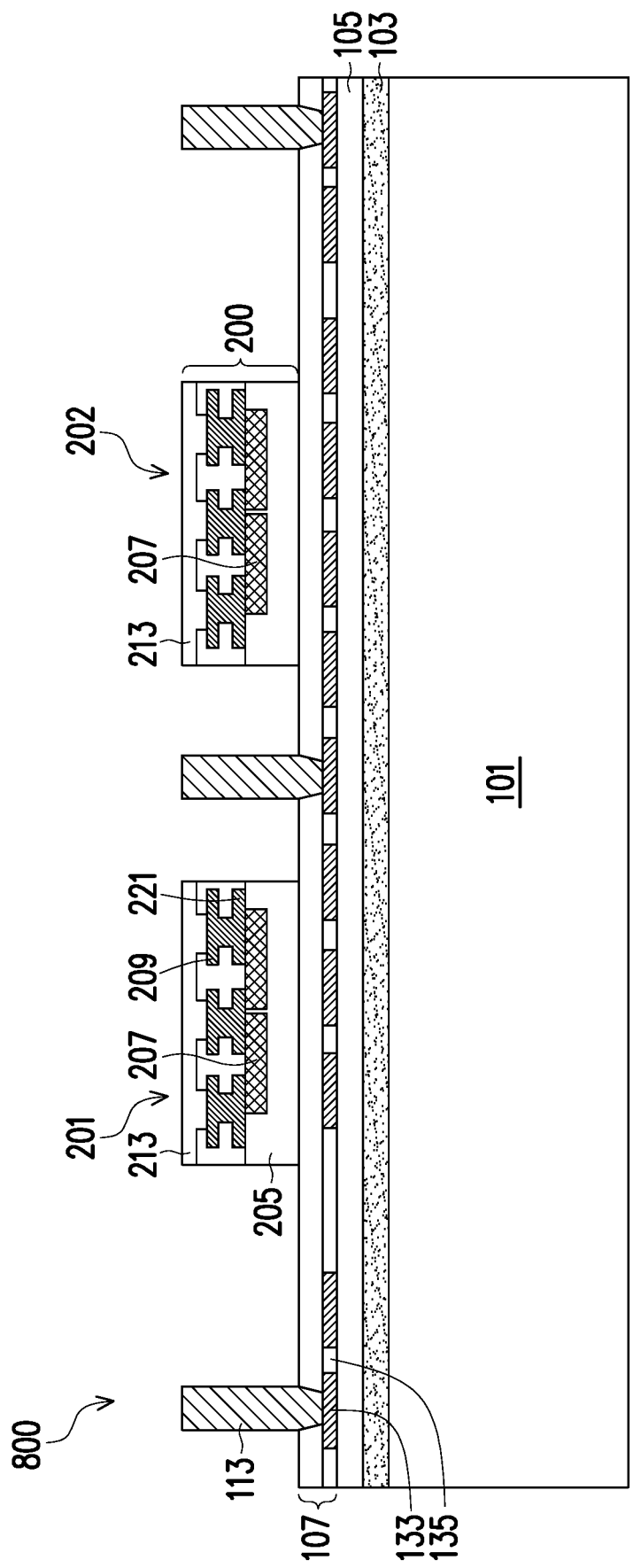

FIG. 2 illustrates a die bonding process in an intermediate step of forming the embedded InD InFO adapter 800, in accordance with some embodiments. First semiconductor die 201 and second semiconductor die 202 are collectively referred to herein as semiconductor dies 200 and are attached to a planar surface of the polymer layer 105 within the TVs 113, according to some embodiments. The semiconductor dies 200 may be attached to the polymer layer 105 using, for example, a die attach film. In an embodiment the die attach film is an epoxy resin, a phenol resin, acrylic rubber, silica filler, or a combination thereof, and is applied using a lamination technique. However, any other suitable material and any suitable method of formation may also be utilized.

The semiconductor dies 200 may be passive devices. Examples of passive devices include but are not limited to devices such as integrated passive devices (IPDs), multi-layer ceramic capacitors (MLCCs), coil inductors, film resistors, or the like. In some embodiments, the semiconductor dies 200 are passive devices (e.g., integrated passive devices (IPDs)) and may be referred to herein as IPDs. In other embodiments, the semiconductor dies 200 may be a combination of passive devices and active devices. Examples of active devices include, but are not limited to integrated active devices (IADs), transistors, fin field effect transistors (FinFETs), diodes, silicon-controlled rectifiers (SCRs), or the like.

In FIG. 2, there is illustrated a first semiconductor die 201 and a second semiconductor die 202. In some embodiments, the second semiconductor die 202 may be the same as the first semiconductor die 201. In other embodiments, the second semiconductor die 202 may be different from the first semiconductor die 201. As illustrated in FIG. 2, the semiconductor dies 200 are passive devices, for example, the first semiconductor die 201 is a first embedded IPD and the second semiconductor die 202 is a second embedded IPD. In some embodiments, the first embedded IPD and the second embedded IPD may be the same type of passive device. In other embodiments, the second embedded IPD may be a different type of passive device from the type of passive device of the first embedded IPD. However, other suitable devices and combinations may also be used. Furthermore, any suitable number of semiconductor dies 200 and any suitable combination of active and passive devices may be attached to the polymer layer 105. According to some embodiments, the semiconductor dies 200 may be passive devices (e.g., first semiconductor die 201 is a first embedded IPD and the second semiconductor die 202 is a second embedded IPD) and the passive devices occupy at least 50% of the planar surface of the polymer layer 105 with the TVs 113 arranged there between. In some embodiments, the Fan-out ratio (e.g., Fan-out area/Si die area) is between about 1.8 and about 2.2.

The semiconductor dies 200 comprise a die substrate 205 and one or more passive devices 207 formed within the die substrate 205. The materials of the die substrate 205 and the devices formed therein depend on the types of passive devices 207 formed therein. As such, in embodiments having a first semiconductor die 201 and a second semiconductor die 202 being of the same type (e.g., embedded IPDs, embedded IADs, or the like), the materials of the die substrate 205 and devices formed therein may be formed of the same materials and have a same construct; although different materials and different constructs may also be possible. The semiconductor dies 200 further comprise die metallization routing layers 221, die contact pads 209, and/or a die protection layer 213 formed over the die substrate 205 and the passive devices formed therein. The materials of these layers formed over the die substrate 205 and the devices formed therein may be formed from the same materials and have the same construct; although different materials and different constructs are also possible.

The die substrate 205 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The one or more passive devices 207 comprise a wide variety of passive devices such as capacitors, resistors, inductors and the like that may be used to generate the desired structural and functional features of the design for the semiconductor dies 200. The one or more passive devices 207 may be formed using any suitable methods either within or else on the die substrate 205.

The die metallization routing layers 221 are formed over the die substrate 205 and over the one or more devices formed therein (e.g., passive devices 207). The die metallization routing layers 221 are designed to connect the various devices, formed within or on the die substrate 205, to one another in order to form functional circuitry. In an embodiment the die metallization routing layers 221 are formed of alternating layers of dielectric and conductive material and may be formed through any suitable process (such as deposition, damascene, dual damascene, etc.). In an embodiment there may be four layers of metallization separated from the die substrate 205 by at least one interlayer dielectric layer (ILD) 211, but the precise number of die metallization routing layers 221 is dependent upon the design of the semiconductor dies 200.

The die contact pads 209 may be formed over and in electrical contact with the die metallization routing layers 221. The die contact pads 209 may comprise aluminum, but other materials, such as copper, may also be used. The die contact pads 209 may be formed using a deposition process, such as sputtering, to form a layer of material (not shown) and portions of the layer of material may then be removed through a suitable process (such as photolithographic masking and etching) to form the die contact pads 209. However, any other suitable process may be utilized. The die contact pads 209 may be formed to have a thickness of between about 0.5 µm and about 4 µm, such as about 1.45 µm. However, any suitable thickness may be used.

According to some embodiments, the die protection layer 213 may be formed over the die contact pads 209 as a protective coating deposited during wafer processing of a wafer (e.g., 8" wafer, or the like) formed with a plurality of first semiconductor die 201 (e.g., first embedded IPD devices). The protective coating is deposited over the wafer using, for example, a curable resin or polyimide coating (e.g., polyimide (PI), polybenzoxazole (PBO), epoxy films, or the like) in order to form the die protection layer 213. The protective coating may be deposited via a spin-on technique and then cured using, e.g., a low temperature curing technique. However, any suitable coatings, any suitable deposition techniques, and any suitable curing techniques may also be used. Once cured, a back grinding tape may be applied over the die protection layer 213 and a back grinding process is performed to reduce the back side (e.g., silicon substrate) of the wafer. After back grinding, a die attach film and dicing tape are applied to the back side of the wafer to attach the wafer to a dicing frame (e.g., 12" dicing frame, or the like). Once attached to the frame, the back grinding tape is removed and a wafer-dicing process (e.g., saw, laser dicing, plasma dicing, or the like) is performed on the wafer to singulate the semiconductor dies from the wafer. As such, the protection coating remains over the semiconductor dies 200 as the die protection layer 213 during transfer and further processing. Once singulated, individual dies may be removed from the dicing tape using, e.g., a thermal process to alter the adhesive properties of the die attach film; then, the individual dies may be transferred (e.g., via a pick and place process) to a carrier frame or to a tray for further processing. In some embodiments, the semiconductor dies 200 may initially be subjected to an optional testing process to identify "known good" dies. As such, only those "known good" dies may be transferred to the carrier frame or to the tray for further processing.

FIG. 2 further illustrates a placement of the individual dies (e.g., "known good" dies if so optionally tested) as the first semiconductor die 201 and the second semiconductor die 202. The first semiconductor die 201 and the second semiconductor die 202 may be transferred from the carrier frame or tray and placed onto the polymer layer 105 between different ones of the TVs 113, e.g., using a pick and place process. However, any other method of placing the first semiconductor die 201 and the second semiconductor die 202 onto the polymer layer 105 may also be utilized. According to some embodiments, the height of the TVs 113 is greater than a height of the semiconductor dies 200.

Figure 3:
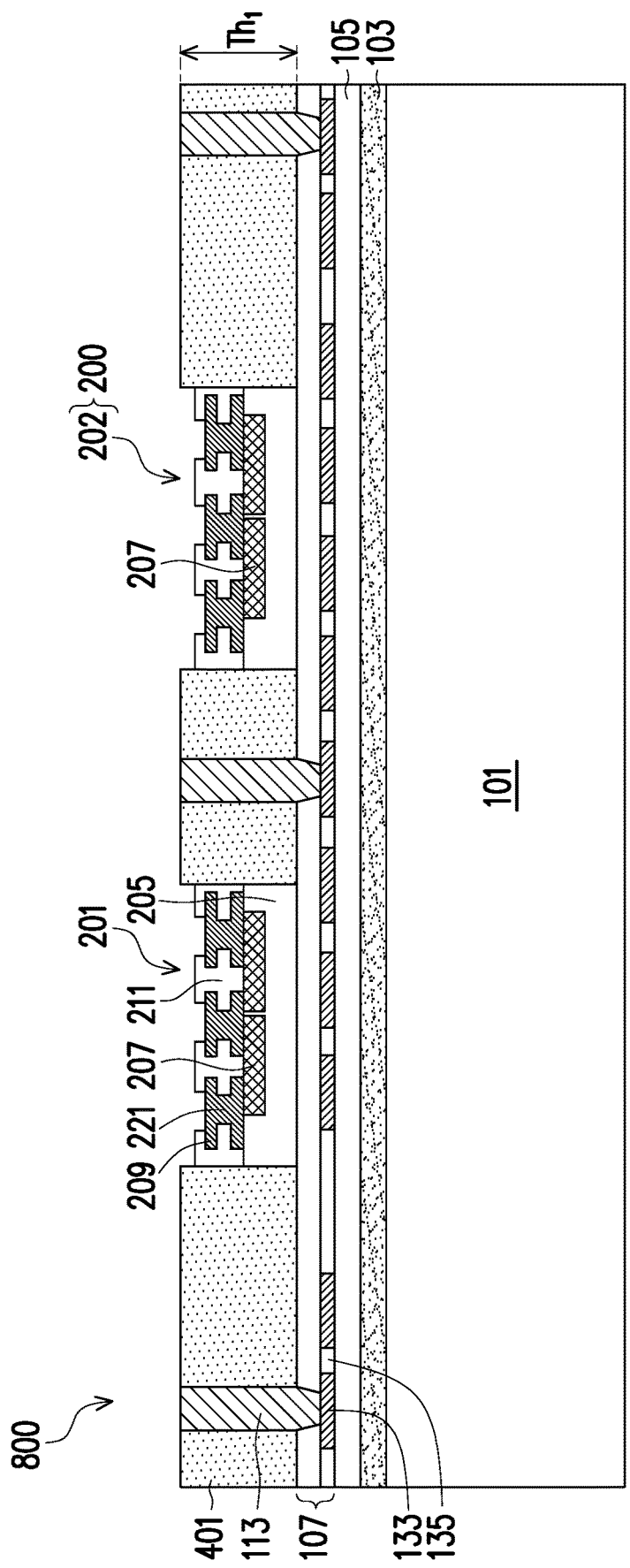

FIG. 3 illustrates a molding process, thinning process, and protection layer removal process in an intermediate step of forming the embedded InD InFO adapter 800, in accordance with some embodiments. The molding process comprises an encapsulation of the TVs 113, the first semiconductor die 201, and the second semiconductor die 202. The encapsulation (e.g., CMC Molding) may be performed in a molding device, which may comprise a top molding portion and a bottom molding portion separable from the top molding portion. When the top molding portion is lowered to be adjacent to the bottom molding portion, a molding cavity may be formed for the first carrier substrate 101, the TVs 113, the first semiconductor die 201, and the second semiconductor die 202.

During the encapsulation process the top molding portion may be placed adjacent to the bottom molding portion, thereby enclosing the first carrier substrate 101, the TVs 113, the first semiconductor die 201, and the second semiconductor die 202 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a first molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the TVs 113, the first semiconductor die 201, and the second semiconductor die 202; the encapsulant 401 may be cured in order to harden the encapsulant 401 for protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3600 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may also be used. Any suitable curing process may be used, and all such processes are fully intended to be included within the scope of the embodiments discussed herein.

FIG. 3 also illustrates a thinning of the encapsulant 401 in order to expose the TVs 113, the first semiconductor die 201, and the second semiconductor die 202 for further processing. The thinning may be performed, e.g., using a mechanical grinding or chemical mechanical polishing (CMP) process whereby chemical etchants and abrasives are utilized to react and grind away the encapsulant 401 until the die protection layer 213 of the first semiconductor die 201 and the second semiconductor die 202 are exposed along with the TVs 113. As such, the die protection layer 213 of the first semiconductor die 201, the die protection layer 213 of the second semiconductor die 202 and the TVs 113 may have planar surfaces that are co-planar with the encapsulant 401. In some embodiments, the encapsulant 401 may be thinned to a thickness $Th_1$ of between about 80 µm and about 300 µm, such as about 50 µm.

However, while the CMP process described above is presented as one illustrative embodiment, it is not intended to be limiting to the embodiments. Any other suitable removal process may be used to thin the encapsulant 401, and to expose the die protection layers 213 of the first semiconductor die 201 and the second semiconductor die 202 and to expose the TVs 113. For example, a series of chemical etches may be utilized. This process and any other suitable process may be utilized to thin the encapsulant 401 and all such processes are fully intended to be included within the scope of the embodiments.

FIG. 3 further illustrates a removal of the die protection layers 213 from the semiconductor dies 200, once the thinning process has completed. In some embodiments, the die protection layer 213 may be removed during the thinning process, for example, during one or more of the mechanical grinding, CMP process, and other removal processes (e.g., the series of chemical etches) used during the thinning process to thin the encapsulant 401. In other embodiments, the die protection layer 213 may be removed after the thinning of the encapsulant 401. For example, the die protection layer 213 may be removed by a process such as a wet etch using etchants selective to the material of the die protection layer 213.

Figure 4:
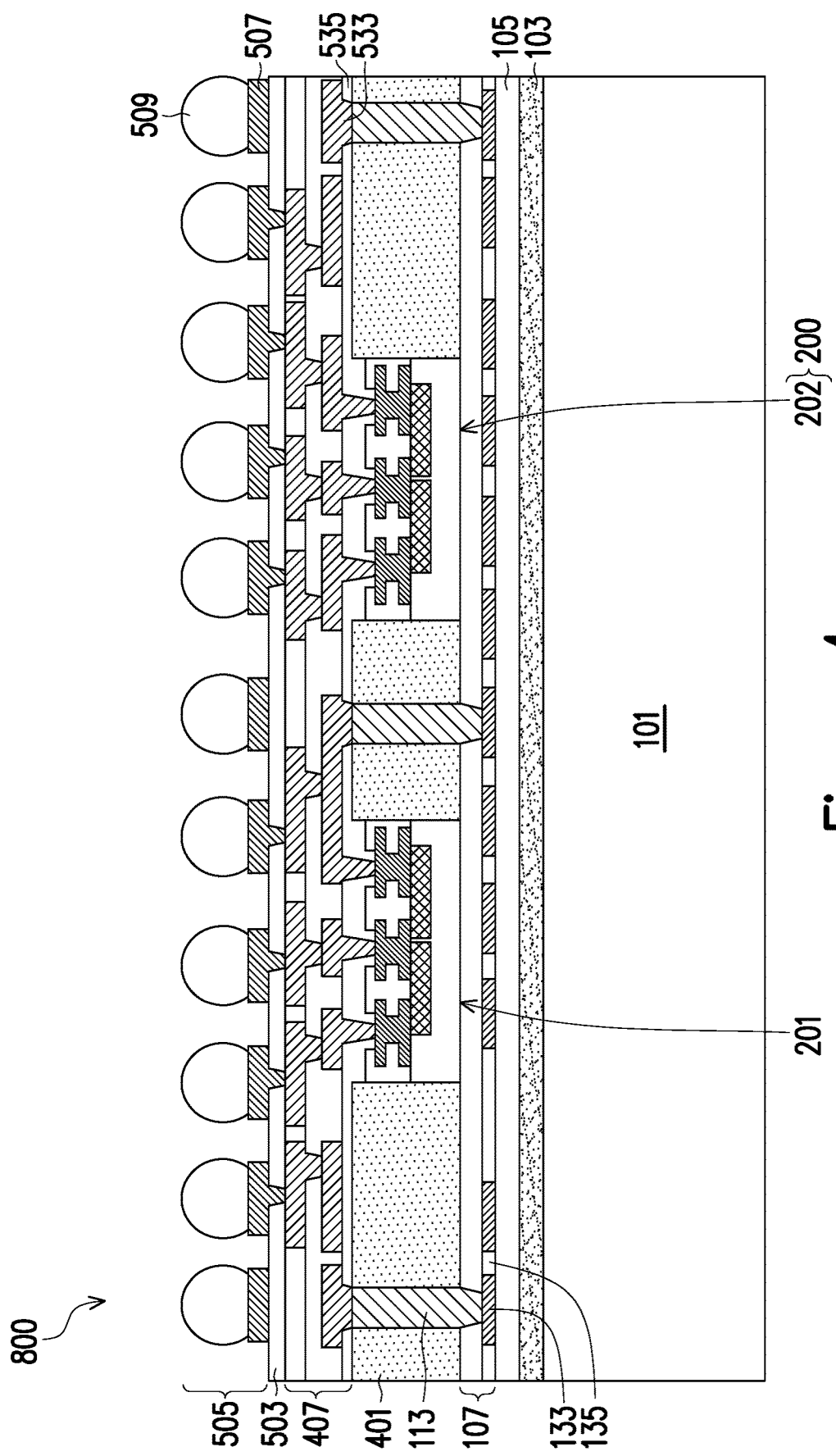

FIG. 4 illustrates a formation of a second redistribution layer (RDL) (e.g., second RDL 407), first external connectors 505, and a pre-cut process in an intermediate step of forming the embedded InD InFO adapter 800, according to some embodiments. Once the thinning process has completed and after the die protection layer 213 has been removed, the second RDL 407 is formed to interconnect the first semiconductor die 201, the second semiconductor die 202, and the TVs 113 to the first external connectors 505.

In an embodiment the second RDL 407 comprises a second series of conductive layers 533 embedded within a second series of dielectric layers 535. In an embodiment, a first dielectric layer of the second series of dielectric layers 535 is formed over the encapsulant 401, over the exposed surfaces of the semiconductor dies 200. The second series of dielectric layers 535 may be formed using any of the materials (e.g., (PBO)) and using any of the deposition processes (e.g., spin-coating process) suitable to form the first series of dielectric layers 135, although any suitable materials and any suitable methods may be utilized.

After the first dielectric layer of the second series of dielectric layers 535 has been formed, openings may be made through the first dielectric layer of the second series of dielectric layers 535 by removing portions of the first dielectric layer of the second series of dielectric layers 535. The openings may be formed using a suitable photolithographic mask and etching process, although any suitable process or processes may be used to pattern the first dielectric layer of the second series of dielectric layers 535.

Once the first dielectric layer of the second series of dielectric layers 535 has been formed and patterned, a first conductive layer of the second series of conductive layers 533 is formed over and through the openings formed within the first dielectric layer of the second series of dielectric layers 535. The second series of conductive layers 533 may be formed by initially depositing a second seed layer (not shown) using any of the materials (e.g., titanium copper alloy) and any of the processes (e.g., chemical vapor deposition (CVD)) suitable to form the first seed layer (not shown) for the first series of conductive layers 133, although any suitable materials and any suitable processes may be used to form the second seed layer. A photoresist (also not shown) is formed to cover the second seed layer and is then patterned to expose those portions of the second seed layer that are located where the first conductive layer of the second series of conductive layers 533 is desired to be located. The photoresist may be formed over the second seed layer for the second series of conductive layers 533 and then patterned using any of the materials and any of the processes suitable for forming and then patterning the photoresist over the first seed layer, although any other suitable materials and any other suitable processes may be utilized.

Once the portions of the second seed layer are exposed through the photoresist in the locations where the first conductive layer of the second series of conductive layers 533 is desired to be located, a conductive material may be formed on the second seed layer using any of the materials (e.g., copper) and any of the deposition processes (e.g., plating) suitable for forming the first series of conductive layers 133. The conductive material used to form the second series of conductive layers 533 may be formed to have any thickness suitable for forming the first series of conductive layers 133 (e.g., 5 µm). However, any suitable material, any suitable deposition methods, and any suitable thicknesses may be used to form the second series of conductive layers 533. Once the conductive material has been formed, the photoresist may be removed through a suitable removal process such as ashing. Additionally, after the removal of the photoresist, those portions of the second seed layer that were covered by the photoresist may be removed using, for example, a suitable etch process and using the conductive material of the first conductive layer of the second series of conductive layers 533 as a mask.

Once the first conductive layer of the second series of conductive layers 533 has been formed, other layers of the second RDL 407 may be formed by repeating steps similar to the first dielectric layer of the second series of dielectric layers 535 and the first conductive layer of the second series of conductive layers 533. These steps may be repeated as desired in order to electrically connect each of the second series of conductive layers 533 to an underlying conductive layer of the second series of conductive layers 533, and may be repeated as often as desired until an uppermost conductive layer of the second series of conductive layers 533 and an uppermost dielectric layer of the second series of dielectric layers 535 has been formed. In an embodiment the deposition and patterning of the second series of conductive layers 533 and the second series of dielectric layers 535 may be continued until the second RDL 407 has a desired number of layers, although any suitable number of individual layers may be utilized.

Also, while the second RDL 407 is illustrated in FIG. 4 with two conductive layers in the second series of conductive layers 533 and two dielectric layers in the second series of dielectric layers 535, this is intended for clarity and is not intended to limit the embodiments. Rather, any suitable number of conductive layers and any suitable number of dielectric layers may be formed by repeating the above described process to form more layers of the second RDL 407. Furthermore, the second RDL 407 may also be referred to herein as a front-side metallization layer of the embedded InD InFO adapter 800.

According to some embodiments, a third passivation layer 503 may be formed over the second RDL 407 in order to provide protection and isolation for the second RDL 407 and the other underlying structures. The third passivation layer 503 may be polybenzoxazole (PBO), although any suitable material, such as polyimide or a polyimide derivative may be utilized. The third passivation layer 503 may be placed using, e.g., a spin-coating process to a thickness of between about 5 µm and about 25 µm, such as about 7 µm, although any suitable method and thickness may also be used.

FIG. 4 further illustrates a formation of the first external connectors 505 to make electrical contact with the second RDL 407. In an embodiment after the third passivation layer 503 has been formed, a plurality of openings may be made through the third passivation layer 503 by removing portions of the third passivation layer 503 to expose portions of the second RDL 407 in desired locations for the first external connectors 505. The openings through the third passivation layer 503 allow for contact between underlying portions of the second RDL 407 and the first external connectors 505. The openings may be formed using a suitable photolithographic mask and etching process, although any suitable process to expose portions of the second RDL 407 may be used.

In an embodiment the first external connectors 505 may be placed on the second RDL 407 through the third passivation layer 503 and may collectively form a ball grid array (BGA) which comprises a eutectic material such as solder, although any suitable materials may also be used. In some embodiments, the first external connectors 505 comprise first underbump metallization (UBMs) (e.g., first UBMs 507) formed through the third passivation layer 503 in the openings over the second RDL 407 and first solder bumps 509 formed over the first UBMs 507. The first UBMs 507 may be formed through one or more deposition and patterning processes.

In an embodiment in which the first external connectors 505 are first solder bumps 509, the first external connectors 505 may be formed of solder using a ball drop method, such as a direct ball drop process. The first solder bumps 509 also may be formed by initially forming a layer of tin through any suitable method such as evaporation, electroplating, printing, or solder transfer, and then performing a reflow in order to shape the material into the desired bump shape.

Once the first external connectors 505 have been formed, a test may be performed to ensure that the structure is suitable for further processing. Furthermore, a pre-cut process may be performed to form openings through the redistribution layer to help prevent or reduce delamination of the second RDL 407 during a subsequent dicing process used to separate individual adapters (e.g., embedded InD InFO adapter 800) from one another.

Figure 5:
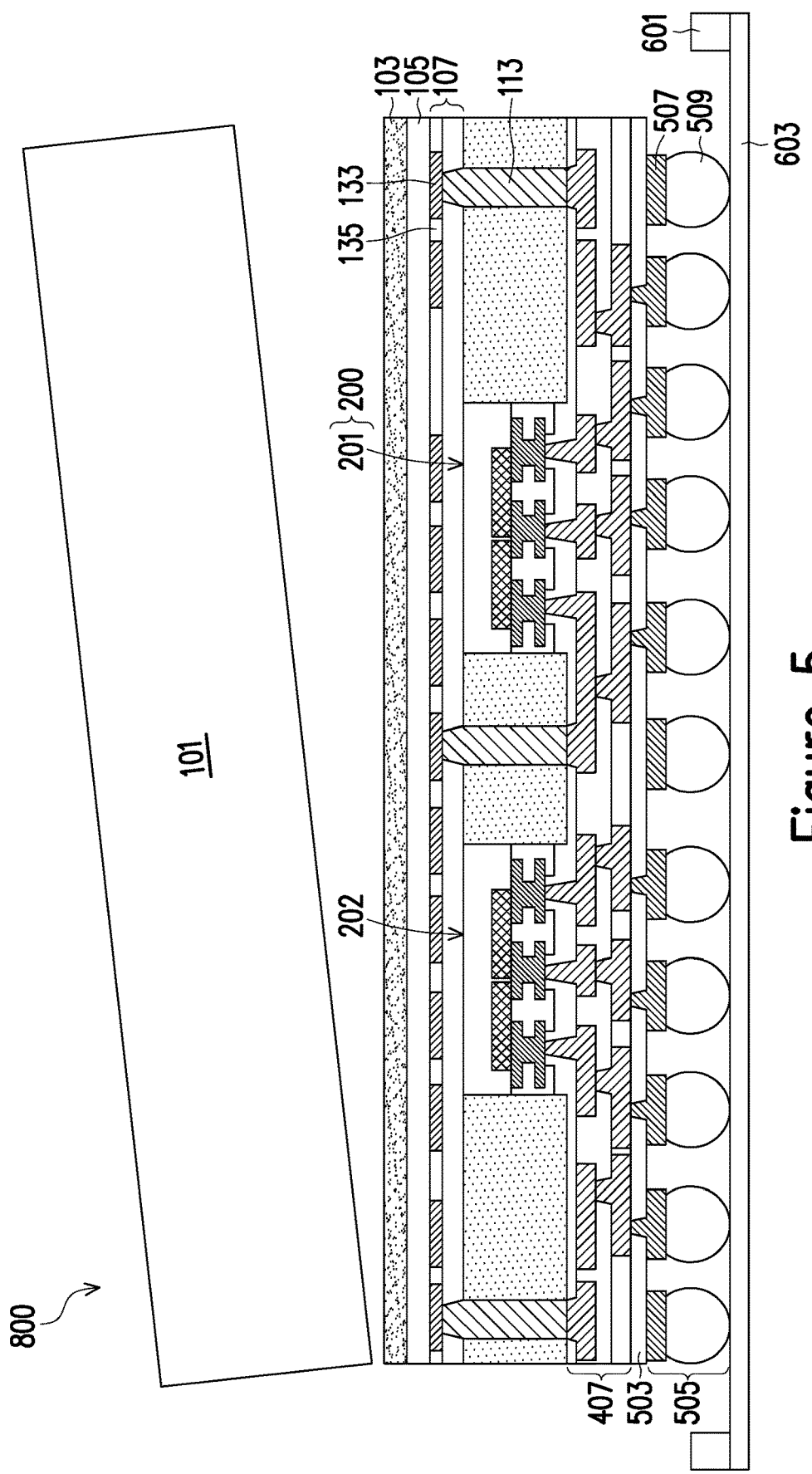

FIG. 5 illustrates a frame mounting process and a carrier de-bonding process in an intermediate step of forming the embedded InD InFO adapter 800, in accordance with some embodiments. In an embodiment, the first external connectors 505 and, hence, the structure including the semiconductor dies 200, may be attached to a first ring structure 601 using a first tape 603 (e.g., ultraviolet tape), although any other suitable adhesive or other suitable attachment may also be used. The first ring structure 601 may be a metal ring intended to provide support and stability for the structure during and after the de-bonding process.

Once the first external connectors 505 and, hence, the structure are attached to the first ring structure 601, the first carrier substrate 101 may be de-bonded from the structure using, e.g., a thermal process to alter the adhesive properties of the first adhesive layer 103. In a particular embodiment an energy source such as an ultraviolet (UV) laser, a carbon dioxide ($CO_2$) laser, or an infrared (IR) laser, is utilized to irradiate and heat the first adhesive layer 103 until the first adhesive layer 103 loses at least some of its adhesive properties. Once performed, the first carrier substrate 101 and the first adhesive layer 103 may be physically separated and removed from the structure.

Figure 6:
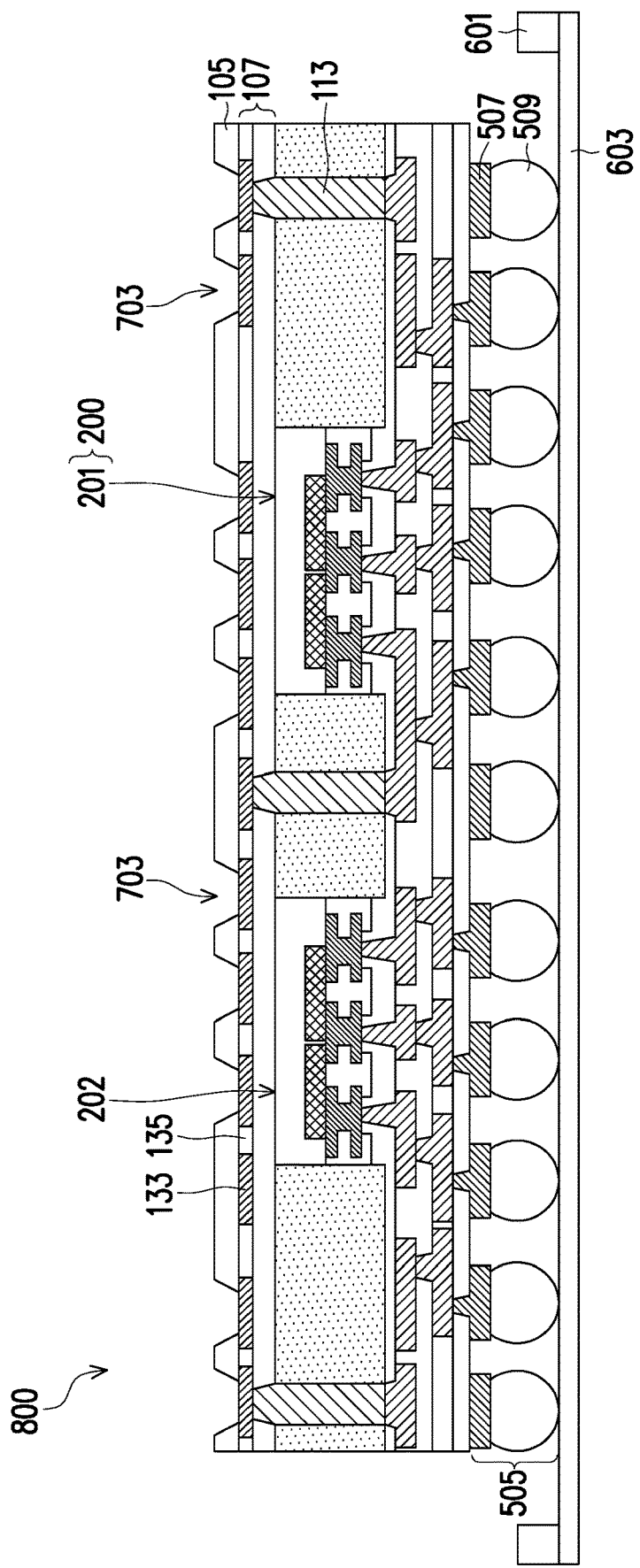

FIG. 6 illustrates a patterning of the polymer layer 105, according to some embodiments, in order to form first openings 703 and to expose the underlying first RDL 107. In an embodiment the polymer layer 105 may be patterned using, e.g., a laser drilling method, by which a laser is directed towards those portions of the polymer layer 105 which are desired to be removed. As such, first openings 703 are formed in the polymer layer 105 to expose the underlying first RDL 107 of the first conductive layer in the first series of conductive layers 133. During the laser drilling process the drill energy may be in a range from 0.1 mJ to about 60 mJ, and a drill angle of about 0 degree (perpendicular to the polymer layer 105) to about 85 degrees to normal of the polymer layer 105.

In another embodiment, the polymer layer 105 may be patterned by initially applying a photoresist (not shown) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized to form the first openings 703. In some embodiments, a cleaning process is performed after forming the first openings 703 in order to remove any residue (e.g., from the laser drilling process).

Figure 7:
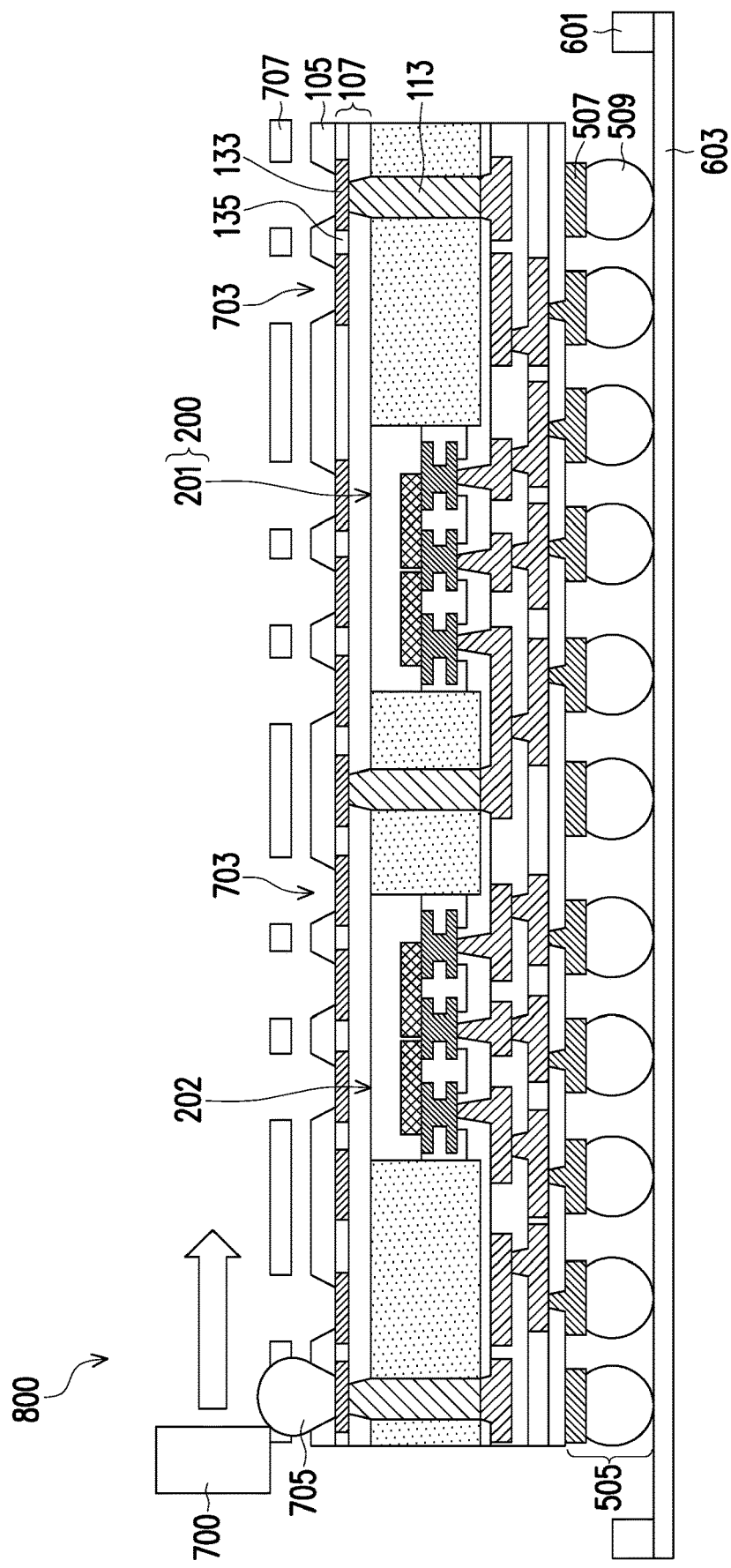

FIG. 7 illustrates a pre-solder paste printing process to place a backside ball pad solder paste within the openings of the polymer layer 105 in order to protect the now exposed vias 113, in accordance with some embodiments. In an embodiment the backside ball pads may comprise a conductive material such as solder on paste or an oxygen solder protection (OSP), although any suitable material may be utilized. In an embodiment the backside ball pads may be applied using a solder paste tool 700 and a stencil 707, although any suitable method of application may be utilized.

Once the backside ball pad has been formed, second external connectors 705 may be formed over the backside ball pads. In an embodiment in which the second external connectors 705 are tin solder bumps, the second external connectors 705 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Figure 8:
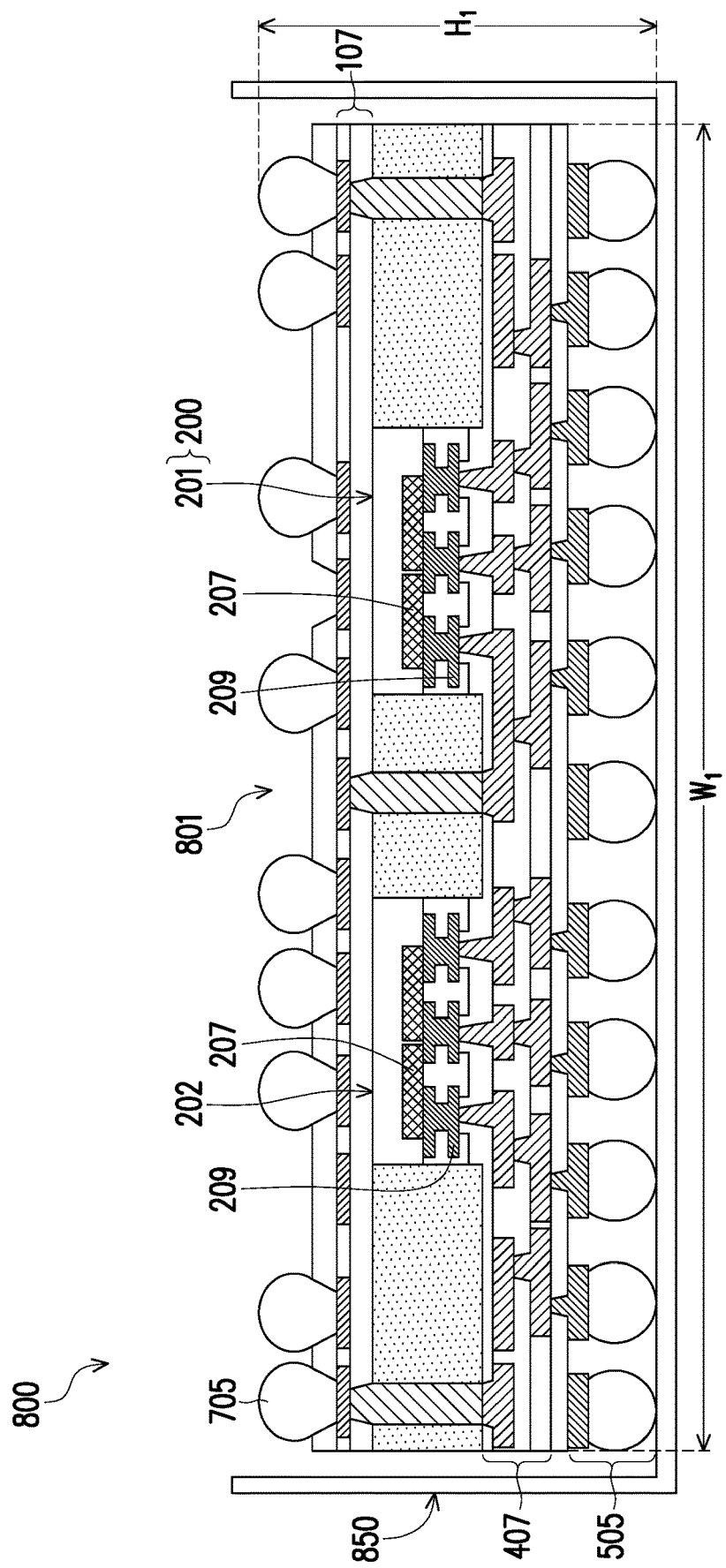

FIG. 8 illustrates a package singulation process and a frame to tray transfer process in an intermediate step of forming the embedded InD InFO adapter 800, in accordance with some embodiments. Once the second external connectors 705 have been deposited on the embedded InD InFO adapter 800, a dicing process (e.g., sawing, laser drill, and the like) is performed to separate the semiconductor package into individual adapters (e.g., embedded InD InFO adapter 800). In an embodiment, the dicing process uses a saw (not shown) to dice the package from a side of the package opposite the pre-cuts and within dicing regions of the package. As the saw cuts downward through a dicing region toward a targeted pre-cut, the embedded InD InFO adapter 800 bordering the targeted pre-cut are separated from one another once the saw meets the opening of the targeted pre-cut. As such, the saw does not contact the second RDL 407 of either of the adjacent adapters (e.g., embedded InD InFO adapter 800). As a result, cracking and/or delamination of the second RDLs 407 from the planar surfaces of the encapsulant 401 and/or the TVs 113 of the adjacent adapters (e.g., embedded InD InFO adapter 800) is avoided or reduced. Although not shown, the pre-cut process and the dicing process discussed above may be performed in other dicing regions, e.g., dicing regions between adjacent adapters (e.g., embedded InD InFO adapter 800) bordering other target pre-cuts (not shown). According to some embodiments, once singulated the embedded InD InFO adapter 800 may have a first overall width $W_1$ of between about 2 mm and about 26 mm, such as about 25 mm; a first overall height $H_1$ of between about 0.2 mm and about 0.5 mm, such as about 0.25 mm; and an overall size, such as area or footprint of between about 50 mm$^2$ and about 2,500 mm$^2$, such as about 625 mm$^2$, in accordance with some embodiments.

After the dicing process is finished and the embedded InD InFO adapter 800 has been singulated from the semiconductor package, the embedded InD InFO adapter 800 is removed from the first tape 603 and the embedded InD InFO adapter 800 is placed into a tray 850. In some embodiments, the tray 850 is formed of a suitable material such as aluminum, aluminum alloys, stainless steel and the like. However, any suitable materials may be used. In some embodiments, the tray 850 may prevent the first external connectors 505 and the second external connectors 705 from being shorted during further handling and processing. As such, the tray 850 may provide protection for the embedded InD InFO adapter 800 until the embedded InD InFO adapter 800 is placed during a 3D packaging process resulting in improved reliability and higher yield of the 3D packaging process.

Figure 9:
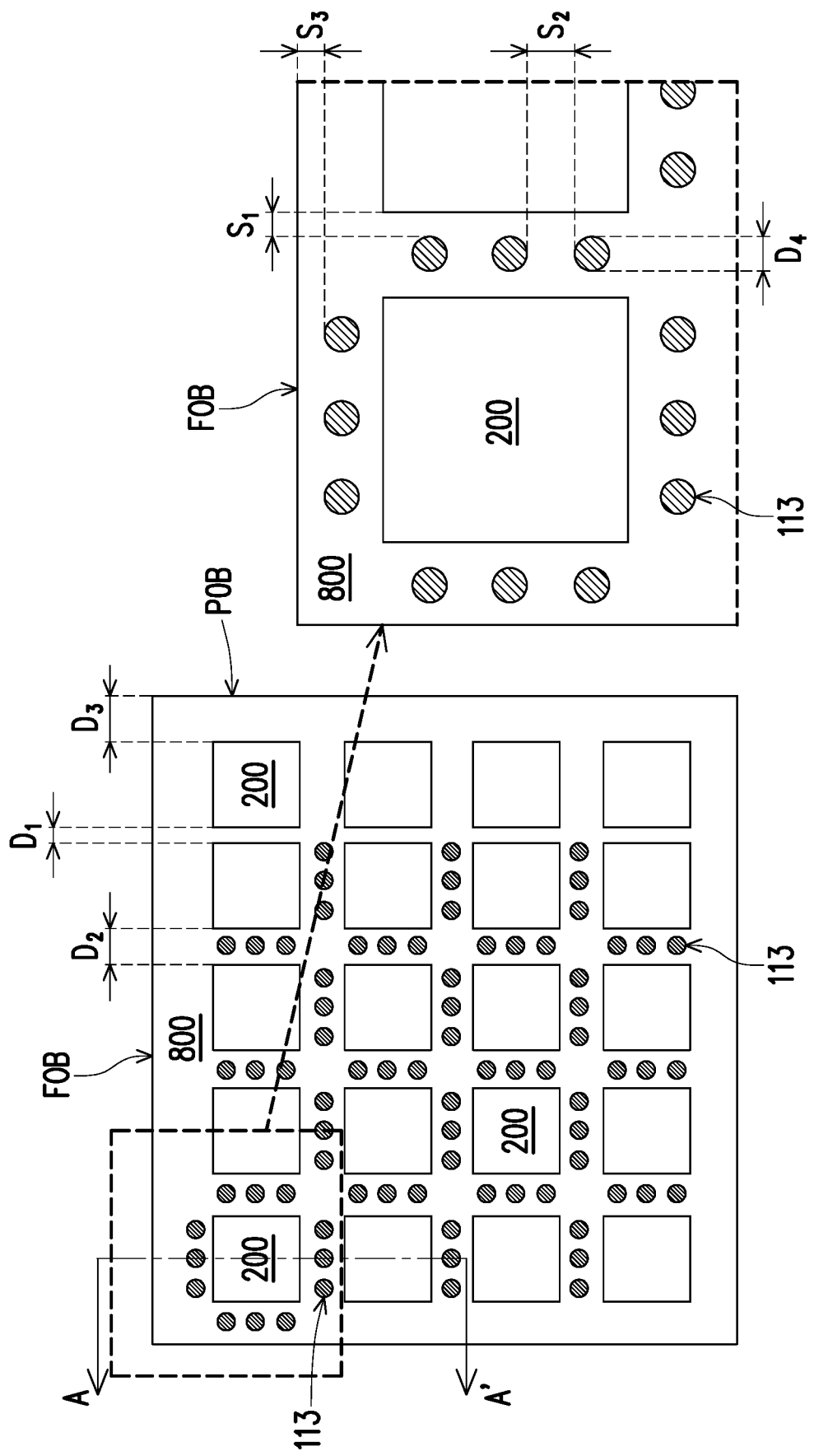
FIG. 9 illustrates an arrangement of dies to through vias (TVs) spacing in a top-down view of the embedded InD InFO adapter of FIG. 8, in accordance with some embodiments.

FIG. 9 illustrates an arrangement and relative spacing of semiconductor dies 200 and TVs 113 in a top-down view and in a magnified portion of the top down view of the embedded InD InFO adapter 800, in accordance with some embodiments. In particular, FIGS. 1-8 illustrate cross sectional views of the top down view of FIG. 9 through line A-A'.

FIG. 9 further illustrates some distances between features of the arrangements of the semiconductor dies 200 and TVs 113 shown in the top down view and magnified portion. According to some embodiments, FIG. 9 illustrates a first distance $D_1$ between a first pair of adjacent dies, without having TVs 113 disposed there between the first pair of adjacent dies, wherein the first distance $D_1$ is between about 40 μm and about 1000 μm, such as about 40 μm. Also illustrated in FIG. 9 is a second distance $D_2$ between a second pair of adjacent dies with TVs 113 disposed there between the second pair of adjacent dies, wherein the second distance $D_2$ is between about 170 μm and about 1000 μm, such as about 170 μm. FIG. 9 further illustrates a third distance $D_3$ between a perimeter edge of the embedded InD InFO adapter 800 and a die of the semiconductor dies 200 that is disposed nearest the perimeter edge (e.g., a perimeter edge of the board (POB)), without any of the TVs 113 disposed between the POB and the die disposed nearest the POB, wherein the third distance $D_3$ is larger than 150 μm. In the magnified portion of FIG. 9 there is a size (e.g., diameter) $D_4$ of the TVs 113, wherein the size $D_4$ is between about 50 μm and about 200 μm, such as about 50 μm. Also illustrated in the magnified portion of FIG. 9 is a first spacing $S_1$ between the TVs 113 and a neighboring die of the semiconductor dies 200, wherein the first spacing $S_1$ is between about 60 μm and about 400 μm, such as about 60 μm. The magnified portion of FIG. 9 further illustrates a second spacing $S_2$ between adjacent vias (e.g., TVs 113), wherein the second spacing $S_2$ is between about 60 μm and about 300 μm, such as about 60 μm. In addition, a third spacing $S_3$ between the TVs 113 and a front edge of the board (FOB) is also illustrated in the magnified portion of FIG. 9, wherein the third spacing $S_3$ is larger than 150 μm. However, other suitable distances, suitable sizes, and suitable spacing may be utilized for the first, second, and third distances ($D_1$, $D_2$, $D_3$), the size ($D_4$), and the first, second, and third spacing ($S_1$, $S_2$, $S_3$).

Figure 10:
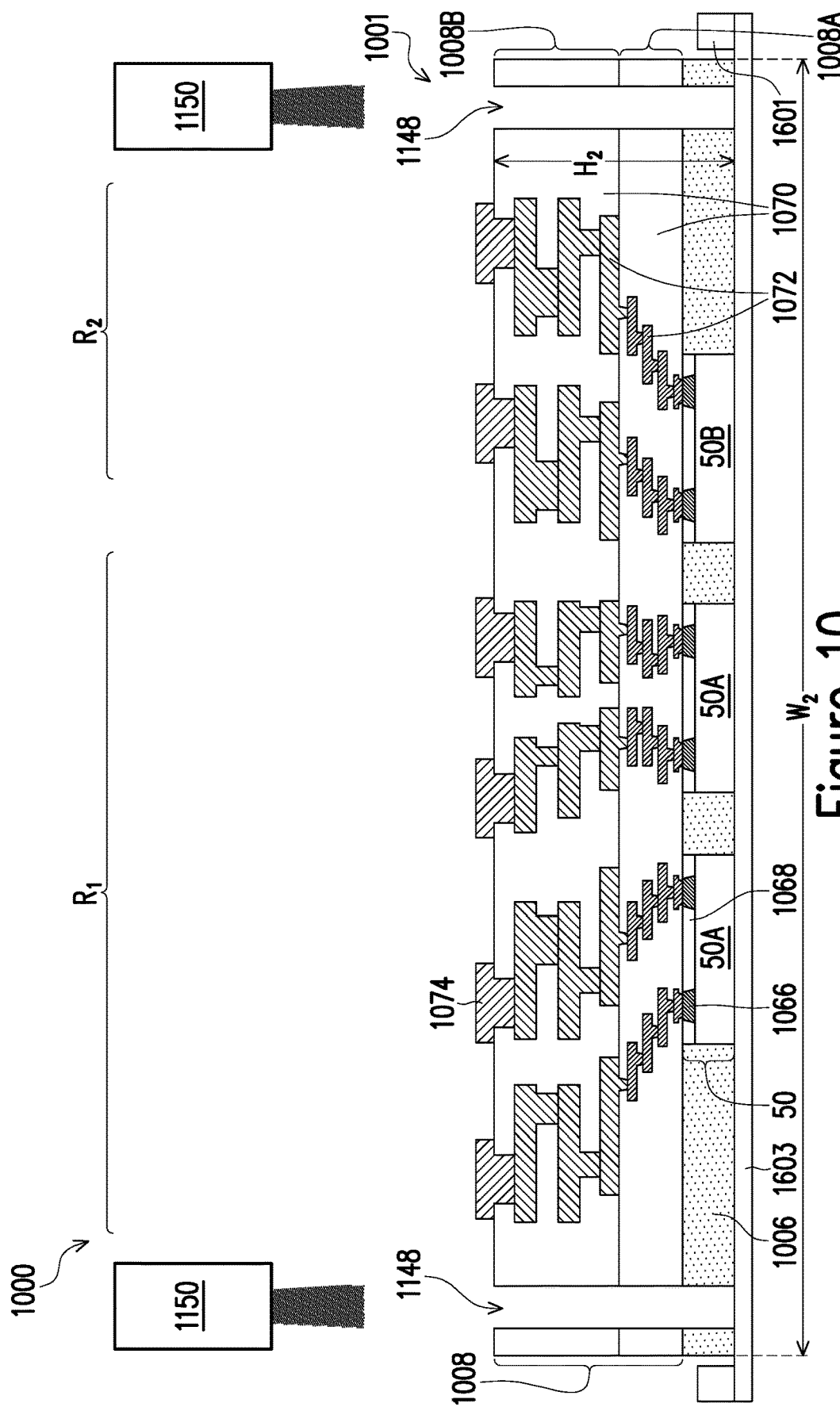
FIG. 10 illustrates intermediate steps in forming a system on wafer (SoW) package, in accordance with some embodiments.

Turning to FIG. 10 for another portion of the current embodiment, FIG. 10 illustrates a SoW package 1000 (e.g., a super large fan-out wafer-scale package with an area greater than or equal to 10,000 mm$^2$) and a laser drilling process in an intermediate step of forming a three dimensional integrated circuit (3D IC) InFO SoW package, in accordance with some embodiments. The SoW package 1000 may be a reconstructed wafer comprising one or more integrated circuit (IC) dies (e.g., IC dies 50) (e.g., two system on chip (SoC) dies (e.g., SoC die 50A) and an input/output (I/O) interface die (e.g., 110 interface die 50B) for providing desired capabilities (e.g., logic functions, memory functions, I/O functions or the like) and the SoW package 1000 may be a single computing device comprising the IC dies 50. For example, the SoW package 1000 may be an artificial intelligence (AI) accelerator in server applications, and each of the IC dies 50 may be a neural network node for the AI accelerator. In some embodiments, each of the IC dies 50 may be physically and electrically connected to external systems. Furthermore, one or more of the IC dies 50 may be physically and electrically connected to external systems and may serve as, e.g., a connecting site to allow other ones of the IC dies 50 (e.g., computing sites) to connect to external systems via the one or more of the IC dies 50 serving as the connecting site.

Example systems for the SoW package 1000 include, but are not limited to, an accelerator of AI servers, high-performance computing (HPC) systems or other data center applications, high power computing devices, cloud computing systems, edge computing systems, and the like. Although three dies, are illustrated in FIG. 10, it should be appreciated that the SoW package 1000 may include any suitable number of IC dies 50, and the IC dies 50 may be laid out in any suitable manner. Furthermore, the IC dies 50 may comprise components of any suitable technology node and may comprise components of the same technology node or may comprise components of different technology nodes (e.g., 7 nm technology, 10 nm technology, or the like). However, any suitable components of any suitable technology node may be utilized for the IC dies 50.

The SoW package 1000 may be formed by initially forming a second adhesive layer (not shown) on a second carrier substrate (not shown) such as, a glass carrier, a ceramic carrier, or the like. The second adhesive layer and the second carrier substrate may be formed using any of the materials (e.g., light to heat conversion (LTHC) coating) and any of the methods (e.g., deposited in liquid form) suitable for forming an adhesive layer over a carrier substrate, as described above. In some embodiments, the second carrier substrate may be a wafer, such that multiple SoW packages 1000 can be formed on the second carrier substrate simultaneously and the second adhesive layer may be a material such as, die attach film (DAF), or the like. As such, the second adhesive layer may be removed along with the second carrier substrate from the overlying structures during subsequent processing steps of forming the SoW package

1000. However, any suitable materials may be used for the second carrier substrate and for the second adhesive layer.

Once the second adhesion layer has been formed, the IC dies 50 may be placed over and adhered via the adhesive layer in desired locations of the second carrier substrate. A desired type and quantity of IC dies 50 are attached in a computing site region $R_1$ of the SoW package 1000 and a desired type and a desired quantity of IC dies 50 are attached in a connecting site region $R_2$ of the SoW package 1000. In some embodiments, a first type of IC dies 50 (e.g., the SoC die 50A) is attached in the computing site region $R_1$, and a second type of IC dies 50, such as the I/O interface die 50B, is attached in the connecting site region $R_2$. Although two IC dies (e.g., SoC die 50A) are illustrated in the computing site region $R_1$ and the I/O interface die 50B is illustrated in the connecting site region $R_2$, it should be appreciated that multiple IC dies 50 of any desired type may be attached adjacent one another in some or all of the sites. When multiple IC dies 50 are attached in the computing site region $R_1$ and/or in the connecting site region $R_2$, the IC dies 50 may be of the same technology node, or may be of different technology nodes. For example, the IC dies 50 may include dies formed at a 10 nm technology node, dies formed at a 7 nm technology node, the like, or combinations thereof.

Once placed in the desired locations, the IC dies 50 may be encapsulated in a second encapsulation process using, e.g., a second molding compound 1006 formed on and around and encapsulating the IC dies 50. The second molding compound 1006 may be an encapsulant, epoxy, or the like, and may be formed using a similar encapsulation process and similar materials as used in forming the encapsulant 401, as set forth above. However, the second molding compound 1006 may be formed via any suitable encapsulation process such as, compression molding, transfer molding, or the like and using any suitable encapsulant. The second molding compound 1006 may be applied in liquid or semi-liquid form and then subsequently cured. In some embodiments, the second molding compound 1006 is formed over the second carrier substrate such that the IC dies 50 are buried or covered, and a planarization process is then performed on the second molding compound 1006 to expose die connectors 1066 of the IC dies 50. As such, topmost surfaces of the second molding compound 1006, the die connectors 1066, and dielectric layers 1068 of the IC dies 50 are coplanar after the planarization process. The planarization process may be, for example, performed using any suitable planarization process (e.g., chemical mechanical planarization (CMP)), as set forth above. However, any suitable planarization process may be used.

Once the IC dies 50 have been encapsulated, a redistribution structure 1008 is formed over the second molding compound 1006 and the IC dies 50. The redistribution structure 1008 includes metallization patterns 1072, dielectric layers 1070, and under-bump metallurgies (UBMs) (e.g., second UBMs 1074). The metallization patterns may also be referred to as redistribution layers or redistribution lines. The layers of the redistribution structure 1008 may be formed in a similar manner and of similar materials as used to form the layers of the second RDL 407, as described above. However, any suitable materials and any suitable methods may also be utilized. The redistribution structure 1008 comprises a series of dielectric layers 1070 formed over a series of metallization patterns 1072. Any suitable thicknesses may be used for the dielectric layers 1070 and the metallization patterns 1072. Furthermore, the redistribution structure 1008 may have any suitable number of dielectric layers and any suitable number of metallization patterns.

Once a desired topmost layer of the redistribution structure 1008 has been formed, the second UBMs 1074 are formed with via portions extending through a topmost layer of the dielectric layers to physically and electrically couple to a topmost layer of the metallization patterns 1072. As such, the second UBMs 1074 allow for external connection to the redistribution structure 1008 and are electrically coupled through the redistribution structure 1008 to the die connectors 1066 of the IC dies 50. The second UBMs 1074 may be formed in a similar manner and of a similar material used to form the first UBMs 507, as set forth above. However, any suitable materials and any suitable process may be used to form the second UBMs 1074 of the redistribution structure 1008.

Furthermore, the layers of the redistribution structure 1008 may comprise metallization patterns and dielectric layers of differing sizes. According to some embodiments, the redistribution structure 1008 comprises a first set of RDL layers 1008A having relatively small sizes as compared to a second set of RDL layers 1008B and the second set of RDL layers 1008B having relatively large sizes as compared to the first set of RDL layers 1008A. The first set of RDL layers 1008A comprises three layers of relatively fine-featured metallization patterns embedded in four layers of relatively thin dielectric layers, as compared to the second set of RDL layers 1008B and the second set of RDL layers 1008B comprises three layers of relatively coarse-featured metallization patterns embedded in four relatively thick dielectric layers, as compared to the first set of RDL layers 1008A. However, the redistribution structure 1008 may have any suitable number of layers, any suitable number of sets of layers, any suitable degree of coarseness of the metallization patterns and any suitable thicknesses of the dielectric layers.

Once the redistribution structure 1008 has been formed, a frame mounting process and a carrier de-bonding process is performed to detach or to "de-bond" the second carrier substrate and adhesive layer from the second molding compound 1006 and IC dies 50 of the SoW package 1000. According to some embodiments, the second carrier substrate and the second adhesive layer may be de-bonded from the SoW package 1000 using similar de-bonding processes used to detach the first carrier substrate 101 and the first adhesive layer 103, as set forth above. For example, a thermal process may be used to alter the adhesive properties of the second adhesive layer until the second adhesive layer loses at least some of its adhesive properties and the second carrier substrate and second adhesive layer are removed from the SoW package 1000. According to some embodiments, once the second carrier substrate and the second adhesive layer have been removed, the SoW package 1000 may have a second overall width $W_2$ of between about 20 mm and about 300 mm, such as about 295 mm; a second overall height $H_2$ of between about 0.05 mm and about 1 mm, such as about 0.8 mm; and an overall size such as area or footprint of between about 10,000 mm$^2$ and about 75,000 mm$^2$, such as about 71,000 mm$^2$, in accordance with some embodiments.

Once the carrier de-bonding process has completed, the SoW package 1000 is then attached to a second ring structure 1601 using a second tape 1603 (e.g., ultraviolet tape), although any other suitable adhesive or attachment may also be used. The second ring structure 1601 and the second tape 1603 provide support and stability to the SoW package 1000 after the carrier de-bonding process and may be similar to the first ring structure 601 (e.g., metal ring) and the first tape 603 used in the carrier de-bonding process of the embedded InD InFO adapter 800, as described above.

Once transferred to the second ring structure 1601, optional screw holes 1148 may be formed through the SoW package 1000 using e.g., a laser drill 1150. However any suitable tool and any suitable process (e.g., mechanical drilling, or the like) may also be used to form the optional screw holes 1148. In some embodiments, the optional screw holes 1148 may be formed by drilling an outline for the optional screw holes 1148 with the laser drill 1150, and then removing the material separated by the outline. The optional screw holes 1148 may have several possible shapes. For example, the optional screw holes 1148 may have square shapes, round shapes, octagonal shapes, or the like. It should be appreciated that other shapes are possible. In particular, the optional screw holes 1148 may have any round shape (e.g., a circle, an oval, an ellipse, etc.) or may have any polygonal shape (e.g., regular or irregular). It should also be appreciated that other types of holes are possible. In particular, the optional screw holes 1148 may be any type of hole (e.g., bolt holes, ring holes, and the like) used with any suitable fastener other than screws (e.g., bolts, retaining rings, inserts, threaded rods, anchors, braces, clamps, and the like).

Figure 11:
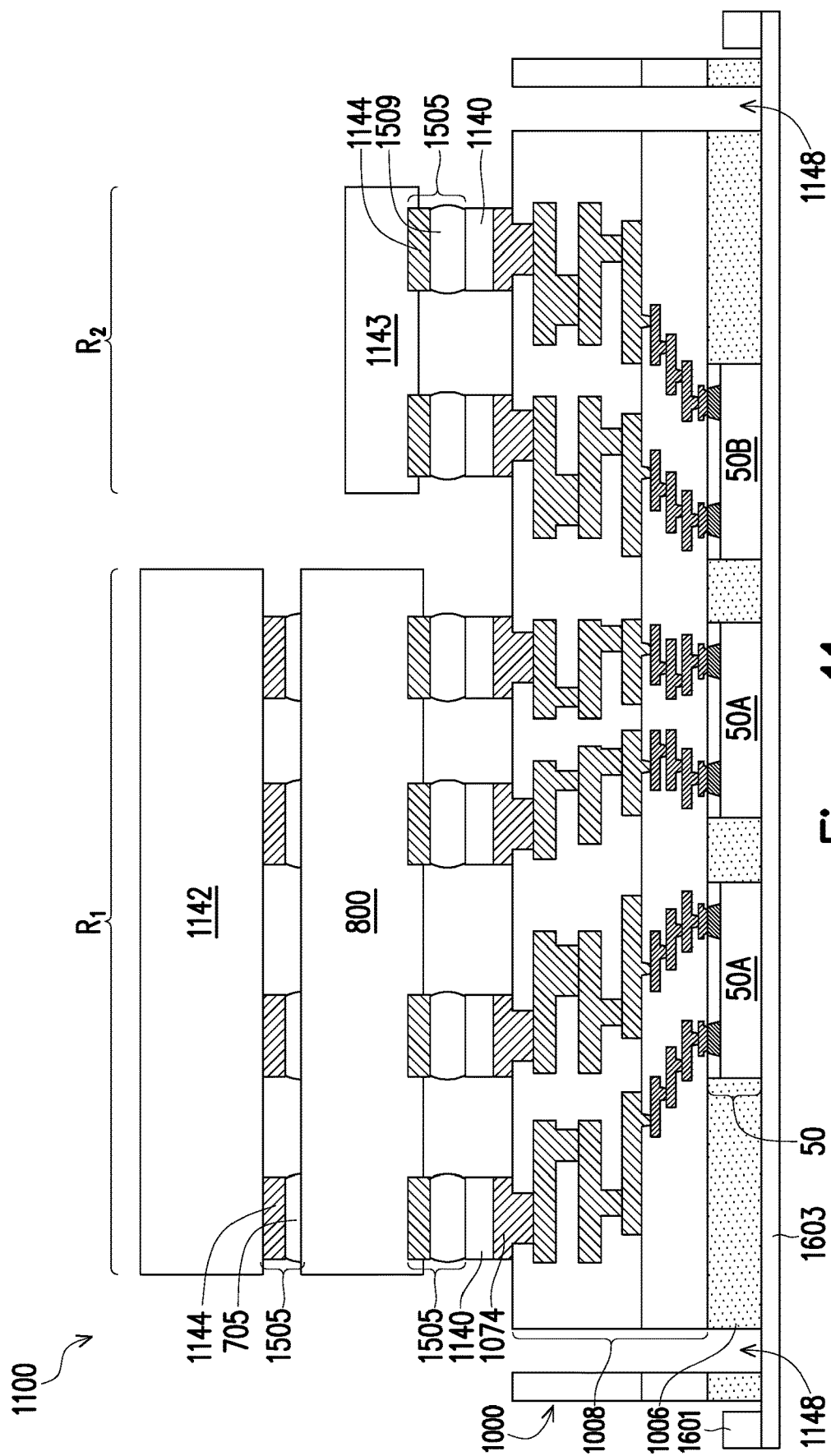
FIGS. 11-17 illustrate a formation of a three dimensional integrated circuit (3D-IC) module socket system comprising the SoW package of FIG. 10 and the embedded InD InFO adapter of FIG. 8, in accordance with some embodiments.

Continuing to FIG. 11, a three dimensional integrated circuit (3D-IC) module socket system 1100 is illustrated according to some embodiments. The 3D-IC module socket system 1100 comprises the SoW package 1000, the embedded InD InFO adapter 800, a socket 1142 and an external system connector 1143. Once the SoW package 1000 (e.g., the first SoW package 1001) has been attached to the second tape 1603 and the optional screw holes 1148 (if provided) have been formed, the embedded InD InFO adapter 800 and the external system connector 1143 are attached to the redistribution structure 1008 of the SoW package 1000. The socket 1142 is attached over the embedded InD InFO adapter 800 and provides an interface for external connection of a functional module (not shown) to the 3D-IC module socket system 1100. The functional module may also be referred to herein as integrated circuit (IC) package. The external system connector 1143 provides an interface for connecting external systems to the 3D-IC module socket system 1100. The functional module and the interfaces provided by the socket 1142 and the external system connector 1143 are discussed in greater detail below.

FIG. 11 further illustrates the socket 1142 and the external system connector 1143 comprising third contact pads 1144, such as aluminum pads, to which external connections are made. In some embodiments, optional third external connectors 1505 may be formed for the external system connector 1143 and/or the socket 1142 prior to being mounting over the SoW package 1000. The optional third external connectors 1505 may be formed by depositing second solder bumps 1509 on the third contact pads 1144 of the external system connector 1143 and/or the socket 1142, according to some embodiments. The second solder bumps 1509 may be deposited using similar process (e.g., a ball drop method) and similar materials (e.g., solder) used to form the first solder bumps 509 of the embedded InD InFO adapter 800. The embedded InD InFO adapter 800 and the external system connector 1143 are mounted to the second UBMs 1074 of the SoW package 1000 using conductive connectors 1140. According to some embodiments, the conductive connectors 1140 are formed by initially forming a layer of pre-solder paste or solder on the second UBMs 1074 of the SoW package 1000. However, any suitable process (e.g., evaporation, electroplating, printing, solder transfer, ball placement, or the like) may be used to form the pre-solder paste or solder on the second UBMs 1074. In some embodiments, the conductive connectors 1140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 1140 may include a conductive material such as solder, copper, aluminum, gold, nickel, silver, palladium, tin, the like, or a combination thereof.

Once the layer of solder has been formed on the second UBMs 1074, the embedded InD InFO adapter 800 is placed, e.g., by a pick and place process, over the second UBMs 1074 in the computing site region $R_1$ of the SoW package 1000; the external system connector 1143 is placed, e.g., by a pick and place process, over the second UBMs 1074 in the connecting site region $R_2$ of the SoW package 1000; and the socket 1142 is placed, e.g., by a pick and place process, over the second external connectors 705 of the embedded InD InFO adapter 800 in the computing site region $R_1$ of the SoW package 1000. However, any suitable placement process may be used to place the embedded InD InFO adapter 800, the external system connector 1143 and/or the socket 1142. The computing site region $R_1$ of the SoW package 1000 correlate to a region of the IC dies 50 (e.g., SoC die 50A) of the SoW package 1000 dedicated to performing computations for functional modules (not shown) interfacing the socket 1142 of the SoW package 1000. The connecting site region $R_2$ of the SoW package 1000 correlates to a region of the IC dies 50 (e.g., 110 interface die 50B) of the SoW package 1000 dedicated to routing connections for the IC dies 50 of the computing site region $R_1$ and, thus, for the functional modules (not shown) interfacing the socket 1142 of the SoW package 1000 to and from external systems. Once the socket 1142 has been placed, the third contact pads 1144 of the socket 1142 are bonded to the second external connectors 705 of the embedded InD InFO adapter 800 and the first external connectors 505 of the embedded InD InFO adapter 800 and the third contact pads 1144 of the external system connector 1143 are bonded to the second UBMs 1074 of the SoW package 1000 using, e.g., a one-time reflow process, according to some embodiments. However, any suitable process may be used to bond the socket 1142 to the embedded InD InFO adapter 800 and to bond the embedded InD InFO adapter 800 and the external system connector 1143 to the SoW package 1000.

Figure 12:
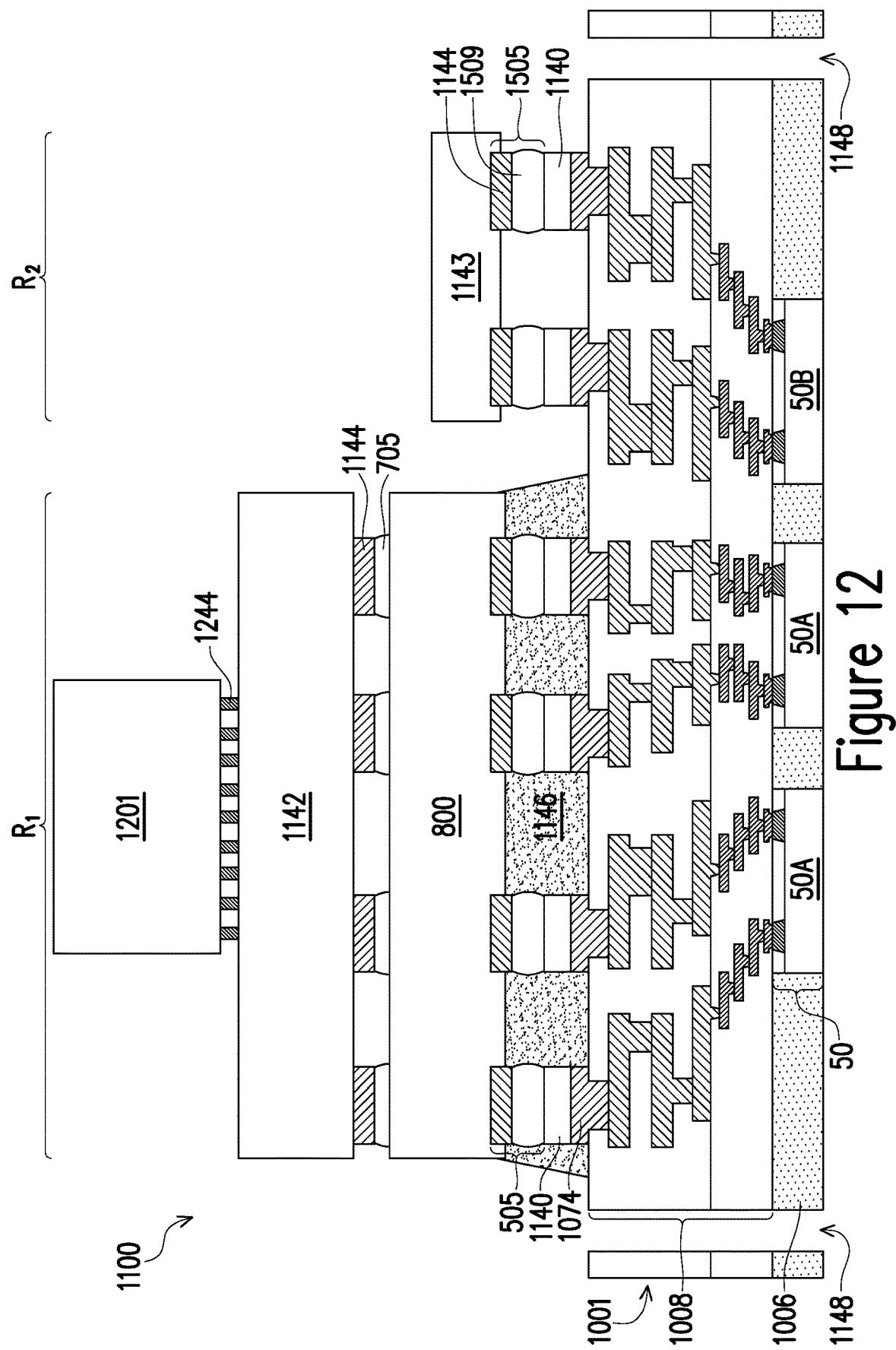

FIG. 12 illustrates an optional under-fill process, a frame de-mount process, and a module install process for the 3D-IC module socket system 1100, in accordance with some embodiments. Once the socket 1142, the embedded InD InFO adapter 800, and the external system connector 1143 have been bonded to the second UBMs 1074 of the SoW package 1000, an optional underfill 1146 may be formed to fill the gaps between the embedded InD InFO adapter 800 and/or the external system connector 1143 and the redistribution structure 1008 of the SoW package 1000. The optional underfill 1146 may be formed after the embedded InD InFO adapter 800 and/or the external system connector 1143 are attached the SoW package 1000 or may be formed before the embedded InD InFO adapter 800 and/or the external system connector 1143 are attached to the SoW package 1000. In some embodiments, the optional underfill 1146 may be formed after the embedded InD InFO adapter 800 and after the external system connector 1143 have been attached using a suitable process (e.g., a capillary flow process, or the like). However, any suitable materials and any suitable processes or combinations of materials and processes may be used to form the optional underfill 1146. In some embodiments, the optional underfill 1146 may also be formed to fill the gaps between the socket 1142 and the embedded InD InFO adapter 800 using the materials and processes described above.

The socket 1142 serves as electrical and physical interfaces for an integrated circuit (IC) package 1201 (also referred to herein as a functional module) that are installed on the socket 1142 subsequent to manufacture of the SoW package 1000 allowing for customization of the 3D-IC module socket system 1100 based on the functions provided by the IC packages 1201 installed therein. For example, a user of the SoW package 1000 may install the IC packages 1201 in the socket 1142 to form completed functional systems with one or more of IC dies 50 of the SoW package 1000. The type of IC packages 1201 selected for installation depends on the type of functional systems desired at the one or more IC dies 50 of the SoW package 1000. Examples of IC packages 1201 that may be installed in the socket 1142 include memory modules, voltage regulator modules, power supply modules, IPD modules, and the like. Furthermore, the socket 1142 includes components, such as a chassis and a plurality of receptors for receiving conductive contacts 1244 (e.g., contact pins) of the IC package 1201. The conductive contacts 1244 of the IC package 1201 are inserted in corresponding receptors of the socket 1142 to physically and electrically couple the IC package 1201 securely to the socket 1142. As such, the IC package 1201 and the 3D-IC module socket system 1100 form a customized and complete functional system at the one or more IC dies 50 of the SoW package 1000 according to the functions provided by the IC package 1201 installed. However, it is understood that the 3D-IC module socket system 1100 may be a complete functional system at the one or more IC dies 50 of the SoW package 1000 according to functions provided by the one or more IC dies 50 with or without the IC package 1201 being installed in the socket 1142.

The external system connector 1143 provides electrical and physical interfaces for the 3D-IC module socket system 1100 to external systems. For example, when the 3D-IC module socket system 1100 is installed as part of a larger external system, such as a data center, the external system connector 1143 may be used to couple the 3D-IC module socket system 1100 to the external system. Examples of external system connectors include receptors for ribbon cables, flexible printed circuits, or the like. However, any suitable connector may be used to couple the 3D-IC module socket system 1100 to the external system.

Figure 13:
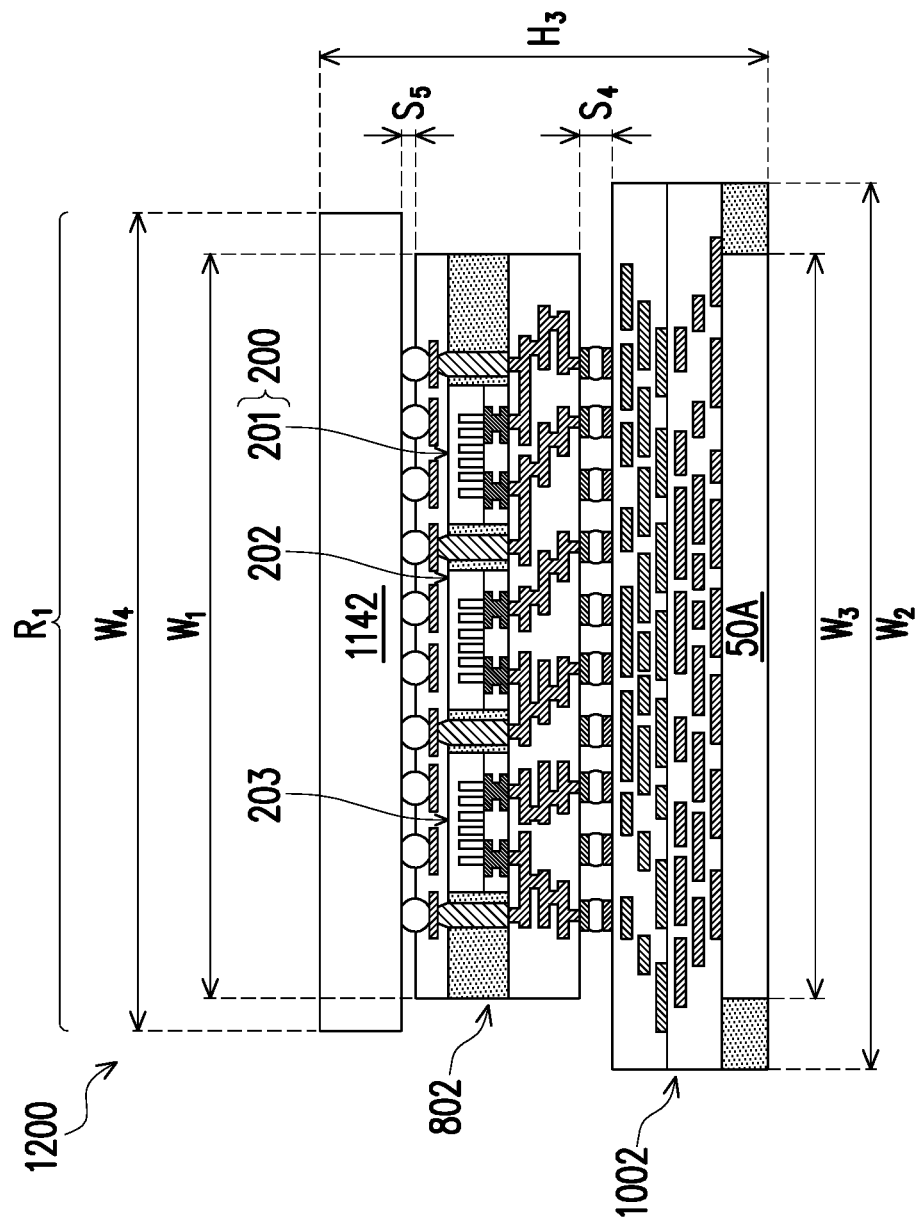

According to another embodiment, FIG. 13 illustrates the computing site region $R_1$ of a second 3D-IC module socket system 1200 comprising a second embedded InD InFO adapter 802 and a second SoW package 1002. The second embedded InD InFO adapter 802, according to some embodiments, comprises a third semiconductor die 203 and the third semiconductor die 203 may be a passive device. In some embodiments, the third semiconductor die 203 may be a passive device (e.g., integrated passive device (IPD)) and may also be referred to herein as the third embedded IPD. The third embedded IPD may be the same type of passive device as either of the first semiconductor die 201 and the second semiconductor die 202. In other embodiments, the third semiconductor die 203 may be a different type of passive device from the types of passive devices of the first semiconductor die 201 and the second semiconductor die 202. In particular, FIG. 13 illustrates the second 3D-IC module socket system 1200 comprising the second embedded InD InFO adapter 802 bonded to the second SoW package 1002 comprising a SoC die 50A and without having an underfill material formed between the second embedded InD InFO adapter 802 and the second SoW package 1002.

FIG. 13 further illustrates relative widths of the second SoW package 1002, the second embedded InD InFO adapter 802, and the socket 1142 of the second 3D-IC module socket system 1200. These relative widths may be used to determine a desired first layout of the components used to form the second 3D-IC module socket system 1200. By determining the desired first layout, short distances may be provided between the first semiconductor die 201, the second semiconductor die 202, and the third semiconductor die 203 (e.g., first, second and third embedded IPDs) and the SoC die 50A, according to some embodiments.

The first layout may be determined using a first set of criteria. According to the first set of criteria, in 3D-IC module socket systems 1100 integrating the SoW package 1000 with a die count of 1 (e.g., the second SoW package 1002 with the SoC die 50A), the first width $W_1$ of the embedded InD InFO adapter 800 (e.g., the second embedded InD InFO adapter 802) is less than the second width $W_2$ of the SoW package 1000 (e.g., the second SoW package 1002) and the fourth width $W_4$ of the socket 1142 is greater than or equal to the third width $W_3$ of the die (e.g., the SoC die 50A), according to some embodiments. As such, the second width $W_2$ of the SoW package 1000 (e.g., the second SoW package 1002) is between about 2.68 mm and about 300 mm, such as about 200 mm; the third width $W_3$ of the SoC die 50A is between about 2.3 mm and about 26 mm, such as about 25 mm; the first width $W_1$ of the embedded InD InFO adapter 800 is between about 2.3 mm and about 30 mm, such as about 25 mm, in accordance with some embodiments; and the fourth width $W_4$ of the socket 1142 is between about 2.3 mm and about 12.5 mm, such as about 28.5 mm, in accordance with some embodiments. However, any suitable widths may be used for first width $W_1$, second width $W_2$, third width $W_3$, and fourth width $W_4$.

FIG. 13 further illustrates a fourth spacing $S_4$ between the second SoW package 1002 and the second embedded InD InFO adapter 802, a fifth spacing $S_5$ between the second embedded InD InFO adapter 802 and the socket 1142, and an overall height of the second 3D-IC module socket system 1200 equal to a third height $H_3$. The fourth spacing $S_4$ between the second SoW package 1002 and the second embedded InD InFO adapter 802 is between about 0.05 mm and about 10 mm, such as about 0.5 mm; the fifth spacing $S_5$ between the second embedded InD InFO adapter 802 and the socket 1142 is between about 0.05 mm and about 10 mm, such as about 0.5 mm; and the third height $H_3$ of the second 3D-IC module socket system 1200 is between about 2.5 mm and about 10 mm, such as about 3.1 mm, in accordance with some embodiments. However, any suitable dimensions may be used for the fourth spacing $S_4$, the fifth spacing $S_5$, and the third height $H_3$.

Figure 14:
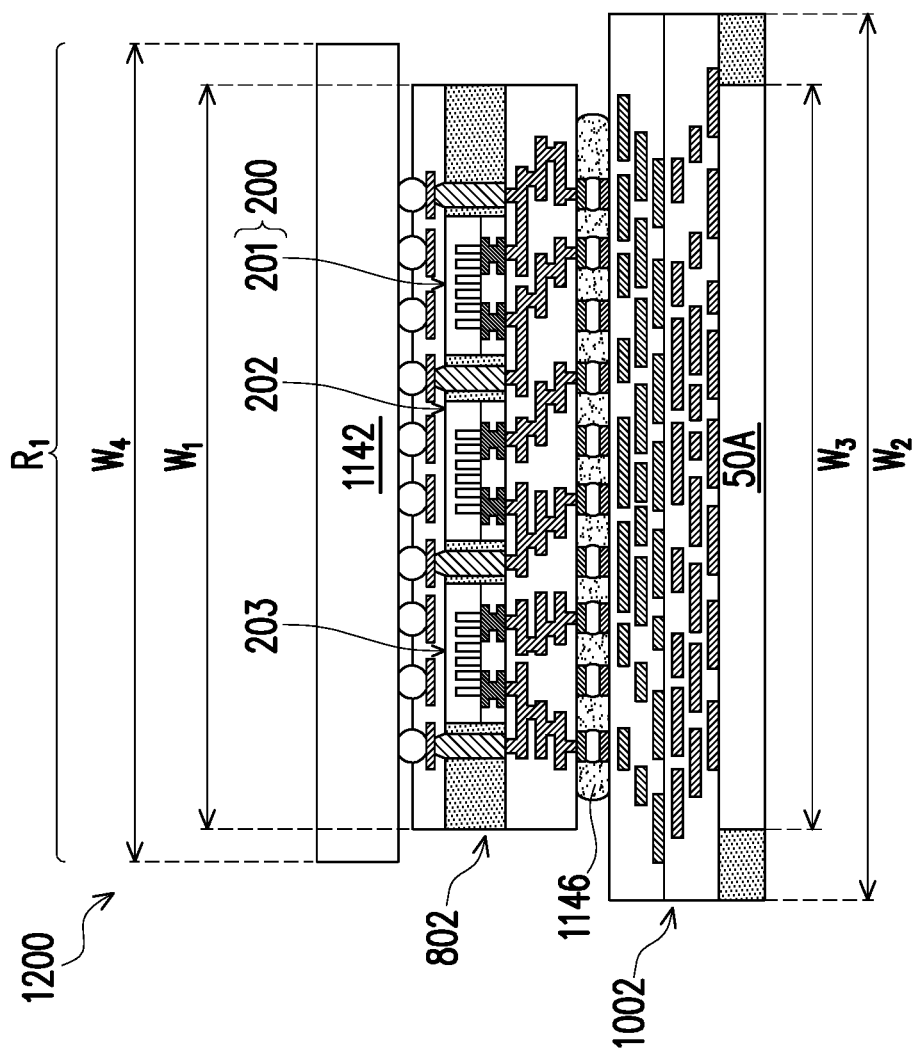

FIG. 14 illustrates the computing site region $R_1$ of the second 3D-IC module socket system 1200 comprising the optional underfill 1146 filling the gaps between the redistribution structure 1008 of the SoW package 1000 and the second embedded InD InFO adapter 802. The optional underfill 1146 may be formed using any of the suitable materials and any of the suitable processes used for the optional underfill 1146 described above with regard to FIG. 12. However, any suitable materials and any suitable processes may be utilized to deposit the optional underfill 1146.

FIG. 14 further illustrates the relative widths of the second SoW package 1002, the second embedded InD InFO adapter 802, and the socket 1142 as illustrated in FIG. 13. However, the optional underfill 1146 also plays a role along with these relative widths in determining a desired second layout of the components used to form the second 3D-IC module socket system 1200. By determining the desired second layout, short distances may be provided between the semiconductor dies 200 (e.g., first, second, and third embedded IPDs) and the IC dies 50 (e.g., SoC die 50A) of the second SoW package 1002, according to some embodiments. The second layout may be determined using a second set of criteria.

According to the second set of criteria, in the 3D-IC module socket system 1100 integrating the SoW package 1000 with a die count of 1 (e.g., the second SoW package 1002 with the SoC die 50A) and comprising the optional underfill 1146 formed between the embedded InD InFO adapter 800 and the SoW package 1000, the difference between the second width $W_2$ of the SoW package 1000 (e.g., the second SoW package 1002) and the first width $W_1$ of the embedded InD InFO adapter 800 (e.g., the second embedded InD InFO adapter 802) is greater than the third width $W_3$ of the IC dies 50 (e.g., the SoC die 50A) by a first margin of between about 100 μm and about 500 μm, such as about 100 μm; the third width $W_3$ of the IC dies 50 (e.g., the SoC die 50A) is less than the fourth width $W_4$ of the socket 1142; and the fourth width $W_4$ of the socket 1142 is less than or equal to the first width $W_1$ of the embedded InD InFO adapter 800 (e.g., the second embedded InD InFO adapter 802). As such, in a 3D-IC module socket system 1100 comprising an optional underfill (e.g., the second 3D-IC module socket system 1200 comprising the optional underfill 1146) the second width $W_2$ of the SoW package 1000 (e.g., the second SoW package 1002) is between about 2.68 mm and about 300 mm, such as about 200 mm; the third width $W_3$ of the IC dies 50 (e.g., the SoC die 50A) is between about 2.3 mm and about 26 mm, such as about 25 mm; the first width $W_1$ of the embedded InD InFO adapter 800 (e.g., the second embedded InD InFO adapter 802) is between about 2.3 mm and about 30 mm, such as about 25 mm, in accordance with some embodiments; and the fourth width $W_4$ of the socket 1142 is between about 2.3 mm and about 12.8 mm, such as about 28.5 mm, in accordance with some embodiments. However, any suitable widths may be used for the first width $W_1$, the second width $W_2$, the third width $W_3$, and the fourth width $W_4$.

Figure 15:
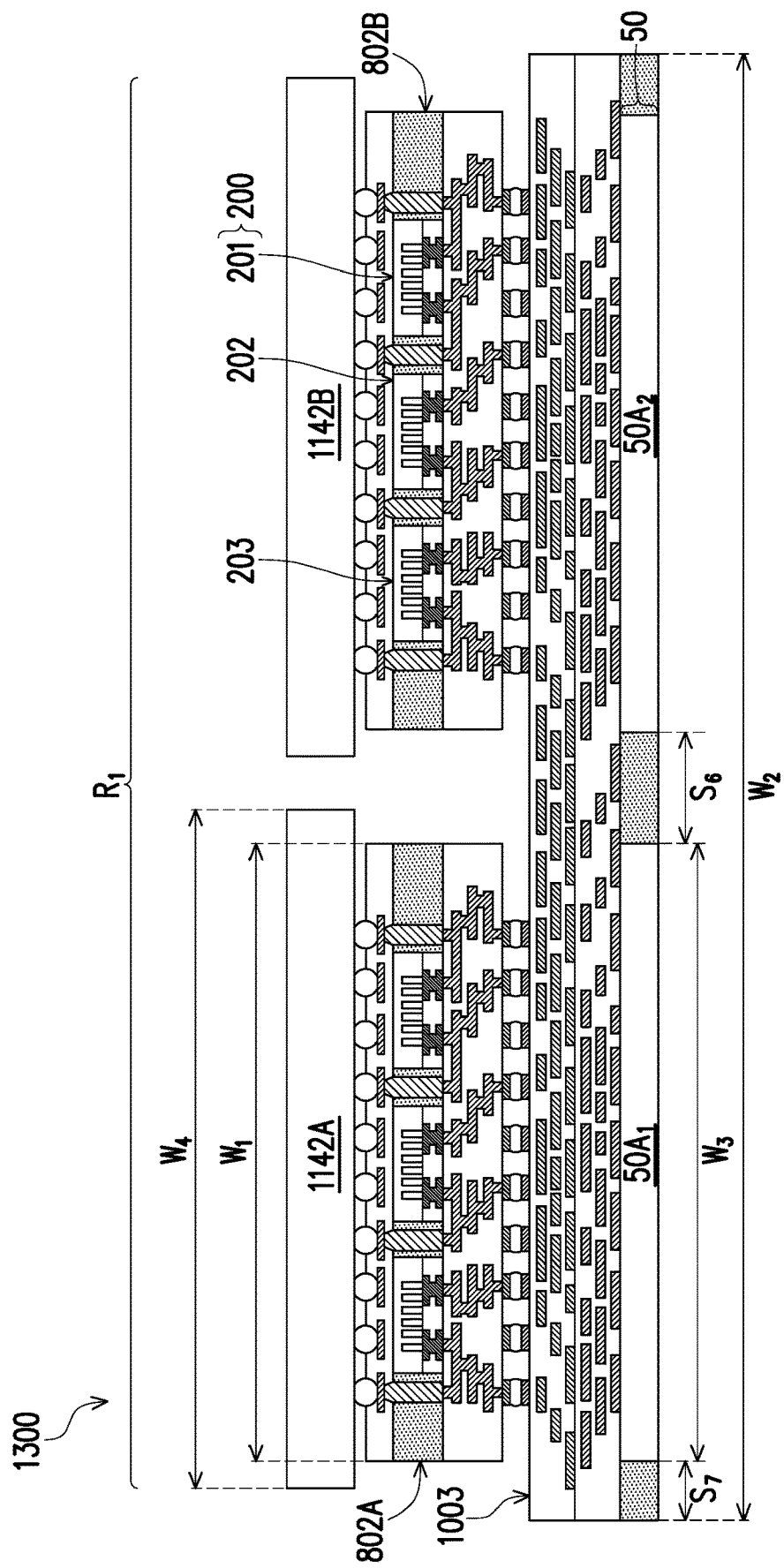

In yet other embodiments, FIG. 15 illustrates the computing site region $R_1$ of a third 3D-IC module socket system 1300 that is similar to the embodiment illustrated in FIG. 13. However, the third 3D-IC module socket system 1300 comprises a third SoW package 1003, two embedded InD InFO adapters 800 and two sockets 1142. The third SoW package 1003 may be formed using any suitable materials and using any suitable methods set forth above. In particular, FIG. 15 illustrates the third 3D-IC module socket system 1300 comprising a first embedded InD InFO adapter 802A bonded to the third SoW package 1003 over a first die of the IC dies 50 (e.g., first SoC die $50A_1$) and comprising a second embedded InD InFO adapter 802B bonded to the third SoW package 1003 over a second die of the IC dies 50 (e.g., second SoC die $50A_2$) and without having an underfill material formed between the two embedded InD InFO adapters 802 and the third SoW package 1003.

FIG. 15 further illustrates the relative widths of the third SoW package 1003, the second embedded InD InFO adapters 802, and the sockets 1142. FIG. 15 further illustrates a sixth spacing $S_6$ spacing between the two IC dies 50 of the third SoW package 1003 and a seventh spacing $S_7$ between a perimeter edge of the third SoW package 1003 and a nearest die of the IC dies 50 to the perimeter edge. In particular, FIG. 15 illustrates the sixth spacing $S_6$ between the first SoC die $50A_1$ and the second SoC die $50A_2$, and the seventh spacing $S_7$ between a perimeter edge of the third SoW package 1003 and the first SoC die $50A_1$ disposed nearest the perimeter edge of the third SoW package 1003. These relative widths may be used to determine a desired third layout of the components used to form the third 3D-IC module socket system 1300 and provide short distances between the semiconductor dies 200 of the embedded InD InFO adapters 800 and corresponding die of the IC dies 50 of the third SoW package 1003, according to some embodiments. The third layout may be determined using a third set of criteria. According to the third set of criteria, for 3D-IC module socket systems 1100 integrating the SoW package 1000 with a die count that is greater than one (e.g., the third SoW package 1003 comprising two IC dies 50) and without using an underfill, the first width $W_1$ of the embedded InD InFO adapter 800 (e.g., the first embedded InD InFO adapter 802A) is less than half the width of the sixth spacing $S_6$ (e.g., half the distance between the first SoC die $50A_1$ and the second SoC die $50A_2$) plus the width of the seventh spacing $S_7$ (e.g., distance between the perimeter edge of the third SoW package 1003 and the first SoC die $50A_1$) plus the third width $W_3$ of the IC dies 50 underlying the embedded InD InFO adapter 800 (e.g., the width of the first SoC die $50A_1$). Furthermore, the third width $W_3$ of the IC dies 50 is less than the fourth width $W_4$ of the socket 1142 (e.g., the width of the first socket 1142A) and the fourth width $W_4$ of the socket 1142 is less than the combination of half the width of the sixth spacing $S_6$ plus the width of the seventh spacing $S_7$ plus the third width $W_3$. As such, the first width $W_1$ of the embedded InD InFO adapter 800 (e.g., the first embedded InD InFO adapter 802A) is between about 2.3 mm and about 30 mm, such as about 25 mm; the second width $W_2$ of the SoW package 1000 (e.g., the width of the third SoW package 1003) is between about 9 mm and about 300 mm, such as about 200 mm, in accordance with some embodiments; and the fourth width $W_4$ of the socket 1142 (e.g., the width of the first socket 1142A) is between about 2.3 mm and about 12.8 mm, such as about 28.5 mm, in accordance with some embodiments. However, any suitable widths may be used for the first width $W_1$, the second width $W_2$, the third width $W_3$ and the fourth width $W_4$.

Figure 16:
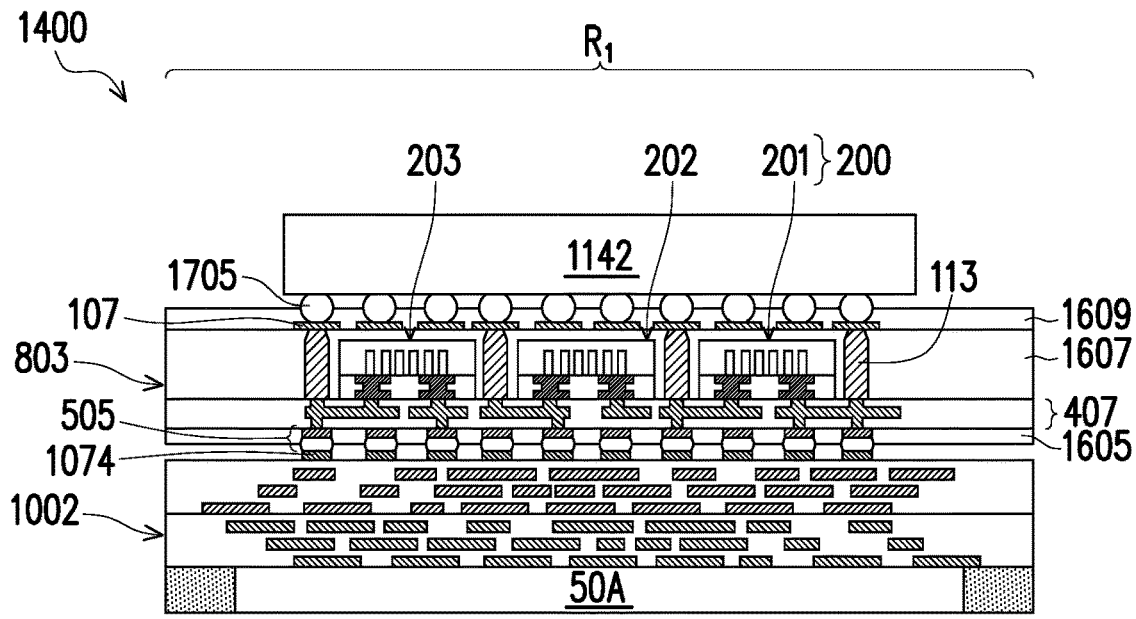

FIG. 16 illustrates, according to some other embodiments, the computing site region $R_1$ of a fourth 3D-IC module socket system 1400. The fourth 3D-IC module socket system 1400 comprises a third embedded InD InFO adapter 803, according to another embodiment. FIG. 16 further illustrates the third embedded InD InFO adapter 803 is stacked between the socket 1142 and the first SoW package 1002. The third embedded InD InFO adapter 803 comprises an organic core substrate 1607 with the semiconductor dies 200, the first RDL 107, the second RDL 407 and the TVs 113 embedded in the organic core substrate 1607. The socket 1142 is coupled via the second external connectors 705 extending through a second passivation layer 1609 to the first RDL 107 of the third embedded InD InFO adapter 803 and the third embedded InD InFO adapter 803 is coupled via the first external connectors 505 extending through a first passivation layer 1605 to the second UBMs 1074 of the second SoW package 1002. As such, the socket 1142 and the semiconductor dies 200 are electrically coupled to the SoC die 50A of the second SoW package 1002 via the third embedded InD InFO adapter 803.

In some embodiments, the organic core substrate 1607 of the third embedded InD InFO adapter 803 may be formed as a printed circuit board (PCB) such as a laminate substrate formed as a stack of multiple thin layers (or laminates) of a polymer material such as FR-4, ABF, BT or the like. However, any other suitable substrate, such as a silicon interposer, a silicon substrate, organic substrate, a ceramic substrate, or the like, may also be utilized, and all such redistributive substrates that provide support and connectivity between the socket 1142 and the second SoW package 1002 are fully intended to be included within the scope of the embodiments. According to some embodiments, the TVs 113 may be formed as plated through holes (PTH) used to connect the socket 1142 to the SoW package (e.g., the second SoW package 1002). However, any suitable conductive via may be used.

Utilizing the third embedded InD InFO adapter 803 as described herein allows the integrated fan out process to be applied for large package applications wherein the package is greater or equal to about 70 mm$^2$. As such, high bandwidth (e.g., greater than 1 TbE) electrical performance can be achieved. Additionally, by utilizing materials to form the third embedded InD InFO adapter 803 as a PCB, as described above, the third embedded InD InFO adapter 803 will have an equivalent coefficient of thermal expansion that is close to a printed circuit board, thereby reducing board level reliability stresses while still achieving a simplified process flow.

Figure 17:
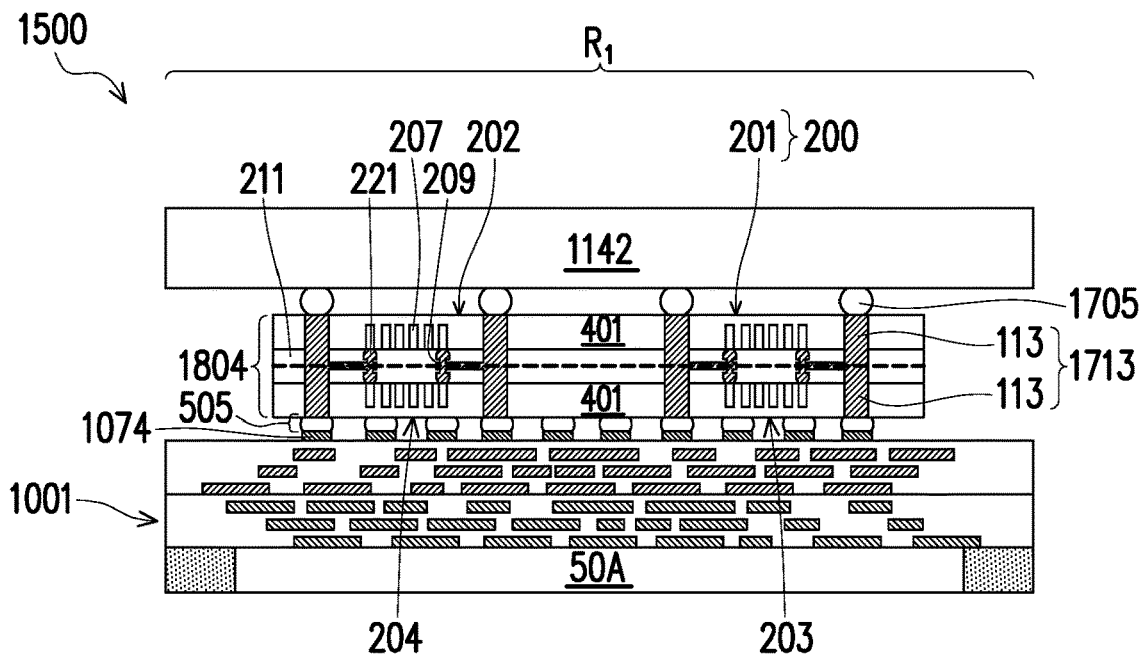

In still further embodiments, FIG. 17 illustrates the computing site region $R_1$ of a fifth 3D-IC module socket system 1500. The fifth 3D-IC module socket system 1500 comprises a fourth embedded InD InFO adapter 804 that is stacked between the socket 1142 and the first SoW package 1001, according to some embodiments. The fourth embedded InD InFO adapter 804 comprises a plurality of semiconductor dies 200 bonded together in a flip-chip arrangement 1804. The semiconductor dies 200 are formed with TVs 113 extending through the individual semiconductor dies 200, and wherein die metallization routing layers 221 electrically couple the passive devices 207 to the die contact pads 209. As such, the die contact pads 209 and first sides of the TVs 113 are exposed in a planar surface at front-sides of the semiconductor dies 200 and second sides of the TVs 113 are exposed in a planar surface of the encapsulant 401 at backsides of the semiconductor dies 200.

Once formed and tested, the semiconductor dies 200 may be coupled to one another using a flip-chip mounting process in some embodiments. For example, the first semiconductor die 201 (e.g., first embedded IPD) and the second semiconductor die 202 (e.g., second embedded IPD) may be manufactured in a first process and the third semiconductor die 203 (e.g., third embedded IPD) and the fourth semiconductor die 204 (e.g., fourth embedded IPD) may be manufactured in a second process. Once manufactured, according to some embodiments, the exposed first sides of the TVs 113 of the first semiconductor die 201 and the second semiconductor die 202 (e.g., first and second embedded IPDs) are placed, e.g., by a pick and place process, over the die contact pads 209 and the exposed first sides of the TVs 113 of the third semiconductor die 203 and the fourth semiconductor die 204 (e.g., third and fourth embedded IPDs), respectively.

The die contact pads 209 and the exposed first sides of the TVs 113 of the semiconductor dies 200 may be bonded together to form the flip-chip arrangement 1804. According to some embodiments, the semiconductor dies 200 may be bonded together by bonding backside surfaces and backside contacts to one another (e.g., by Si-to-Si direct bonding). In other embodiments, the semiconductor dies 200 may be bonded together using a reflow process. In an embodiment, the reflow process may be a thermal heating process. However, any suitable material and any suitable process may be used to bond the die contact pads 209 and the TVs 113 of the flip-chip arrangement 1804 together.

According to yet other embodiments, the semiconductor dies 200 may be bonded together using a hybrid bonding process. In an embodiment the backside surfaces, the backside contacts, and the TVs 113 of the first and second semiconductor dies 201 and 202 and the third and fourth semiconductor dies 203 and 204 may be chemically activated and then placed in alignment with each other. Once activated and aligned, the first semiconductor die 201 and the second semiconductor die 202 are placed in physical contact with the third semiconductor die 203 and the fourth semiconductor die 204 to begin a chemical bonding. Subsequently, the semiconductor dies 200 are subjected to thermal treatments, contact pressures, activations processes, and/or cleaning processes. As such, the semiconductor dies 200 are fused to one another with backside surfaces, backside contacts, and the TVs 113 of the semiconductor dies 200 being aligned and fused to one another forming hybrid bonds with multiple bond types (e.g., metal to metal bonds as well as dielectric to dielectric bonds).

As such, the first semiconductor die 201 and the second semiconductor die 202 (e.g., first and second embedded IPDs) form a top portion of the flip-chip arrangement 1804 and the third semiconductor die 203 and the fourth semiconductor die 204 (e.g., first and second embedded IPDs) form a bottom portion of the flip-chip arrangement 1804. Furthermore, the TVs 113 of the first semiconductor die 201 and the second semiconductor die 202 (e.g., first and second embedded IPDs) form top portions of stacked TVs 1713 and the TVs 113 of the third semiconductor die 203 (e.g., third embedded IPDs) and the fourth semiconductor die 204 (e.g., fourth embedded IPDs) form bottom portions of the stacked TVs 1713.

Once the bonding is complete, the passive devices 207 of the semiconductor dies 200 are electrically coupled to the socket 1142 via the die metallization routing layers 221, the stacked TVs 1713, and the second external contacts 1705 on a second side of the flip-chip arrangement 1804. In addition, the passive devices 207 of the semiconductor dies 200 are electrically coupled to the SoC die 50A via the die metallization routing layers 221, the stacked TVs 1713, and the first external connectors 505 on a first side of the flip-chip arrangement 1804. Furthermore, the socket 1142 is electrically coupled via the second external contacts 1705 on the second side of the flip-chip arrangement 1804, the stacked TVs 1713 and the first external connectors 505 on the first side of the flip-chip arrangement 1804.

Embodiments are described herein that are directed towards embedding semiconductor dies 200 (e.g., integrated passive devices (IPDs) and/or integrated active devices (IADs)) in an integrated Fan-Out (InFO) adapter (e.g., the embedded InD InFO adapter 800) allowing for the embedded semiconductor dies and a socket 1142 (e.g., socket connector for connecting to a power module) to be stacked on the system on wafer (SoW) package 1000 to form a three dimensional integrated circuit (3D-IC) module socket system 1100. As such, a planar area of the SoW package 1000 is conserved and made available for interfacing the socket and a short distance is provided between the embedded IPDs and the computing dies (e.g., SoC die 50A) of the SoW package 1000 which enhances a power distribution network (PDN) performance of the 3D-IC) module socket system 1100. The stacking and integration of the semiconductor dies 200 into the embedded InD InFO adapter 800 allows for more of the ball grid array (BGA) at the interface with the SoW package 1000 to be dedicated to the socket landscape associated with the socket 1142. As such, improved current handling is also achieved with the 3D stacking and integration of the semiconductor dies 200 into the embedded InD InFO adapter 800.

In accordance with an embodiment, a device includes: a first redistribution layer; a second redistribution layer; an integrated passive device disposed between the first redistribution layer and the second redistribution layer, a contact pad of the integrated passive device being connected to the first redistribution layer; and conductive vias physically connecting the first redistribution layer to the second redistribution layer, wherein the integrated passive device is disposed between the conductive vias. In an embodiment, the device further includes: first external contacts disposed adjacent to the first redistribution layer; and second external contacts disposed adjacent to the second redistribution layer. In an embodiment, the device further includes an encapsulant, wherein the conductive vias and the integrated passive device are embedded in the encapsulant. In an embodiment, the device further includes an organic core substrate, wherein the conductive vias and the integrated passive device are embedded in the organic core substrate. In an embodiment, the integrated passive device comprises a plurality of passive devices. In an embodiment, the plurality of passive devices occupies at least 50% of a surface area of the first redistribution layer.

In accordance with another embodiment, a system includes: a system on wafer package; a socket; and an integrated fan-out adapter disposed between and separating the socket and the system on wafer package, the integrated fan-out adapter includes: a first redistribution layer and a second redistribution layer; an integrated passive device disposed between the first redistribution layer and the second redistribution layer, the integrated passive device being connected to the first redistribution layer; and conductive vias connecting the first redistribution layer to the second redistribution layer and connecting the socket to the system on wafer package. In an embodiment, the system on wafer package comprises a computing die and wherein the integrated fan-out adapter is disposed over the computing die. In an embodiment, the system on wafer package includes a connecting die disposed in a connecting region of the system on wafer package. In an embodiment, the integrated fan-out adapter further includes at least one other device disposed between the first and second redistribution layers, connected to the first redistribution layer, and embedded in the encapsulant. In an embodiment, the integrated passive device and all other integrated passive devices of the at least one other device occupy at least fifty percent of an area defined between the first and second redistribution layers. In an embodiment, the system further includes an encapsulant, the integrated passive device and the conductive vias being embedded in the encapsulant.

In accordance with yet another embodiment, a method includes: depositing a first metallization layer; forming conductive vias to the first metallization layer; placing an integrated passive device over the first metallization layer; and depositing a second metallization layer over the conductive vias and over the integrated passive device, the second metallization layer being connected to the conductive vias and the integrated passive device. In an embodiment, the method further includes: depositing first external contacts adjacent to the second metallization layer; and depositing second external contacts adjacent to the first metallization layer. In an embodiment the method further includes: bonding the first external contacts to external contacts of a system on wafer package; and bonding the second external contacts to external contacts of a socket. In an embodiment, the method further includes bonding an external system connector to external contacts of the system on wafer package. In an embodiment the method further includes connecting an integrated circuit package to the socket. In an embodiment the method further includes encapsulating the conductive vias and the integrated passive device in an encapsulant. In an embodiment the placing the integrated passive device places a plurality of integrated passive devices, and wherein the plurality of integrated passive devices are the only devices placed over the first metallization layer prior to the depositing the second metallization layer. In an embodiment the placing the integrated passive device places a plurality of integrated passive devices and wherein the plurality of integrated passive devices takes up at least 50% of the surface area of the first metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first redistribution layer;
    a second redistribution layer;
    an integrated passive device disposed between the first redistribution layer and the second redistribution layer, a contact pad of the integrated passive device being connected to the first redistribution layer;
    conductive vias physically connecting the first redistribution layer to the second redistribution layer, wherein the integrated passive device is disposed between the conductive vias;
    first external connectors bonded to the first redistribution layer; and
    second external connectors bonded to the second redistribution layer, wherein the first external connectors are bonded to external contacts of a system on wafer package, and wherein the second external connectors are bonded to external contacts of a socket.

2. The device of claim 1, further comprising an encapsulant, wherein the conductive vias and the integrated passive device are embedded in the encapsulant.

3. The device of claim 1, further comprising an organic core substrate, wherein the conductive vias and the integrated passive device are embedded in the organic core substrate.

4. The device of claim 1, wherein the integrated passive device comprises a plurality of passive devices.

5. The device of claim 4, wherein the plurality of passive devices occupies at least 50% of a surface area of the first redistribution layer.

6. A system, comprising:
    a system on wafer package;
    a socket; and an integrated fan-out adapter disposed between and separating the socket and the system on wafer package, the integrated fan-out adapter comprising:
a first redistribution layer and a second redistribution layer;
an integrated passive device disposed between the first redistribution layer and the second redistribution layer, the integrated passive device being connected to the first redistribution layer; and
conductive vias connecting the first redistribution layer to the second redistribution layer and connecting the socket to the system on wafer package.

7. The system of claim 6, wherein the system on wafer package comprises a computing die and wherein the integrated fan-out adapter is disposed over the computing die.

8. The system of claim 7, wherein the system on wafer package comprises a connecting die disposed in a connecting region of the system on wafer package.

9. The system of claim 8, further comprising an encapsulant, the integrated passive device and the conductive vias being embedded in the encapsulant.

10. The system of claim 9, wherein the integrated fan-out adapter further comprises at least one other device disposed between the first and second redistribution layers, connected to the first redistribution layer, and embedded in the encapsulant.

11. The system of claim 10, wherein the integrated passive device and all other integrated passive devices of the at least one other device occupy at least fifty percent of an area defined between the first and second redistribution layers.

12. A device, comprising:
a first metallization layer;
conductive vias to the first metallization layer;
an integrated passive device over the first metallization layer;
a second metallization layer over the conductive vias and over the integrated passive device, the second metallization layer being connected to the conductive vias and the integrated passive device;
first external contacts adjacent to the second metallization layer; and
second external contacts adjacent to the first metallization layer wherein the first external contacts are bonded to external contacts of a system on wafer package, and wherein the second external contacts are bonded to external contacts of a socket.

13. The device of claim 12, wherein an external system connector is bonded to external contacts of the system on wafer package.

14. The device of claim 13, wherein an integrated circuit package is connected to the socket.

15. The device of claim 13, wherein the conductive vias and the integrated passive device are encapsulated within an encapsulant.

16. The device of claim 13, wherein the integrated passive device is one of a plurality of integrated passive devices, and wherein the plurality of integrated passive devices are the only devices placed over the first metallization layer prior to the depositing the second metallization layer.

17. The device of claim 13, wherein the integrated passive device is one of a plurality of integrated passive devices and wherein the plurality of integrated passive devices takes up at least 50% of a surface area of the first metallization layer.

18. The device of claim 1, wherein the system on wafer package comprises a connecting die disposed in a connecting region of the system on wafer package.

19. The device of claim 6, wherein the integrated passive device comprises a plurality of passive devices.

20. The system of claim 12, wherein the system on wafer package comprises a connecting die disposed in a connecting region of the system on wafer package.

* * * * *